(12) United States Patent
Cho et al.

(10) Patent No.: US 12,082,462 B2
(45) Date of Patent: Sep. 3, 2024

(54) DISPLAY DEVICE

(71) Applicant: Samsung Display Co., Ltd., Yongin-si (KR)

(72) Inventors: Seung Hwan Cho, Yongin-si (KR); Ji Ryun Park, Cheonan-si (KR); Ki Ho Bang, Hwaseong-si (KR); Won Suk Choi, Seoul (KR); Yoon Sun Choi, Hwaseong-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 425 days.

(21) Appl. No.: 17/567,226

(22) Filed: Jan. 3, 2022

(65) Prior Publication Data
US 2022/0336565 A1 Oct. 20, 2022

(30) Foreign Application Priority Data
Apr. 20, 2021 (KR) .................. 10-2021-0050970

(51) Int. Cl.
*H01L 27/32* (2006.01)
*H10K 59/131* (2023.01)

(52) U.S. Cl.
CPC ................................ *H10K 59/131* (2023.02)

(58) Field of Classification Search
CPC .......... H10K 59/131; G09G 3/36; G09G 3/23
See application file for complete search history.

(56) References Cited

U.S. PATENT DOCUMENTS

2015/0379908 A1* 12/2015 Kim .................. G09G 3/006
345/84
2022/0320253 A1 10/2022 Cho et al.

FOREIGN PATENT DOCUMENTS

KR 1020220138917 A 10/2022

* cited by examiner

*Primary Examiner* — John A Bodnar
(74) *Attorney, Agent, or Firm* — CANTOR COLBURN LLP

(57) ABSTRACT

A display device includes a plurality of first constant voltage lines extended along a first direction and arranged along a second direction crossing the first direction, a plurality of second constant voltage lines extended along the second direction and arranged along the first direction, a first overlap area in which the plurality of first constant voltage lines and the plurality of second constant voltage lines overlap and contact each other, and a second overlap area in which the plurality of first constant voltage lines and the plurality of second constant voltage lines overlap and are insulated from each other.

20 Claims, 18 Drawing Sheets

DISPLAY DEVICE

This application claims priority to Korean Patent Application No. 10-2021-0050970 filed on Apr. 20, 2021, and all the benefits accruing therefrom under 35 U.S.C. 119, the contents of which in its entirety are herein incorporated by reference.

BACKGROUND

(1) Field

The present disclosure relates to a display device.

(2) Description of the Related Art

With the advancement of the information age, the demand for a display device for displaying an image has increased with various forms. As the display device, various types of display devices such as a liquid crystal display (LCD) device and an organic light emitting display (OLED) device have been used. Among them, the organic light emitting display device displays an image by using an organic light emitting diode that generates light by recombination of electrons and holes.

The display device includes a display area for displaying an image and a non-display area which is adjacent to the display area. Conductive lines for applying a signal to the display area are disposed in the non-display area.

SUMMARY

A display device having a thin bezel has been developed. When a size of the non-display area is reduced for a thin bezel, a path through which conductive fan-out lines may pass may be insufficient. Therefore, some conductive lines may be extended toward a display area of the display device after being fanned out from a pad portion thereof. Particularly, a second power voltage line may be provided to include a mesh shape in the display area.

An embodiment of the present disclosure provides a display device in which visibility of a mesh pattern is reduced even though a second power voltage line which transmits a second power voltage includes the mesh pattern in a display area.

The objects of the present disclosure are not limited to those mentioned above, and additional objects of the present disclosure, which are not mentioned herein, will be clearly understood by those skilled in the art from the following description of the present disclosure.

An embodiment of a display device includes a plurality of first constant voltage lines extended along a first direction and arranged along a second direction crossing the first direction, a plurality of second constant voltage lines extended along the second direction and arranged along the first direction, a first overlap area in which the plurality of first constant voltage lines and the plurality of second constant voltage lines respectively overlap and contact each other, and a second overlap area in which the plurality of first constant voltage lines and the plurality of second constant voltage lines respectively overlap and are insulated from each other.

An embodiment of a display device includes a semiconductor layer including a channel of a transistor, a first insulating layer on the semiconductor layer, a gate electrode of the transistor which is on the first insulating layer, a second insulating layer on the gate electrode of the transistor, a plurality of first constant voltage lines on the second insulating layer, a third insulating layer on the plurality of first constant voltage lines, and a plurality of second constant voltage lines on the third insulating layer, overlapping the plurality of first constant voltage lines with the third insulating layer interposed therebetween to define overlap areas where the plurality of first constant voltage lines overlap the plurality of second constant voltage lines. The overlap areas include a first overlap area where a first constant voltage line and a second constant voltage line contact each other, and a second overlap area where the plurality of first constant voltage lines and the plurality of second constant voltage lines are insulated from each other by the third insulating layer.

In one or more embodiment of the display device, visibility of a mesh pattern defined by a second power voltage line may be reduced even though the mesh pattern is in a display area.

The effects according to the embodiments of the present disclosure are not limited to those mentioned above, and more various effects are included in the following description of the present disclosure.

BRIEF DESCRIPTION OF THE DRAWINGS

The above and other features of the present disclosure will become more apparent by describing in detail embodiments thereof with reference to the attached drawings, in which.

DETAILED DESCRIPTION

Figure 1:
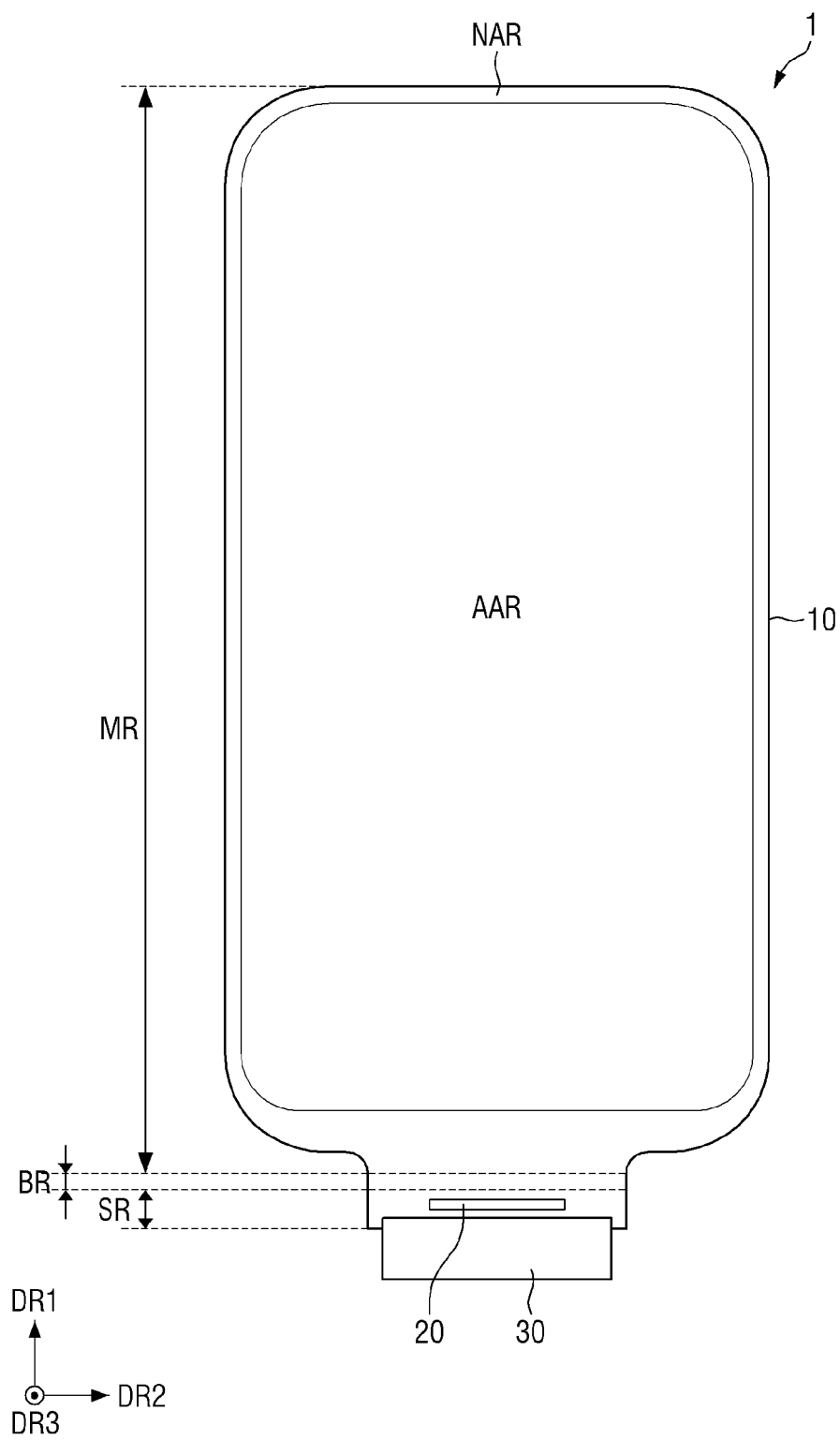
FIG. 1 is a plane view illustrating an embodiment of a display device.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

It will also be understood that when a layer is referred to as being related to another element such as being "on" another layer or substrate, it can be directly on the other layer or substrate, or intervening layers may also be present. In contrast, when a layer is referred to as being related to another element such as being "directly on" another layer or substrate, no other layer or substrate, or intervening layers is present. The same reference numbers indicate the same components throughout the specification. "As used herein, a reference number may indicate a singular element or a plurality of the element. For example, a reference number labeling a singular form of an element within the drawing figures may be used to reference a plurality of the singular element within the text of specification. In the attached figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present disclosure will be described with reference to the accompanying drawings.

Figure 2:
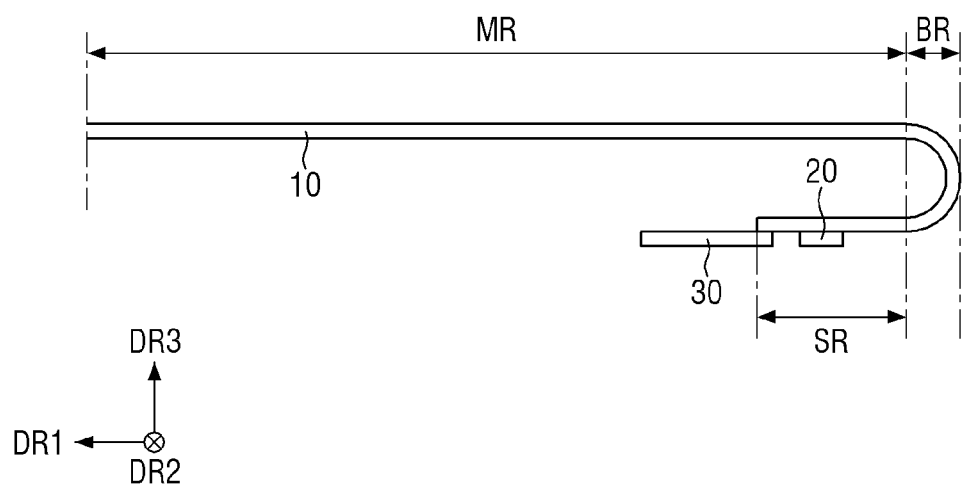
FIG. 2 is a side view illustrating an embodiment of the display device of FIG. 1 which is bent.

FIG. 1 is a plane view illustrating an embodiment of a display device 1, and FIG. 2 is a side view illustrating an embodiment of the display device 1 of FIG. 1 which is bent. FIG. 1 shows a plane view of the display device 1 which is unbent or flat. FIG. 2 shows a cross-sectional side view of the display device 1 which is bent.

In the following drawings, a first direction DR1 refers to a vertical direction in a plane view, and a second direction DR2 refers to a horizontal direction in a plane view. The first direction DR1 and the second direction DR2 cross each other. A third direction DR3 is a direction crossing both the first direction DR1 and the second direction DR2, and refers to a thickness direction of the display device 1 and various components or layers thereof like a display panel 10.

Referring to FIGS. 1 and 2, the display device 1 is an electronic device that displays a moving image or a still image. The display device 1 may be used as a display screen of various products such as a television, a laptop computer, a monitor, a billboard, and a device for Internet of things (IoT) as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation device, and an ultra mobile PC (UMPC).

The display device 1 may include a display panel 10. The display panel 10 may be flexible and may include a flexible substrate that includes a flexible polymer material such as polyimide. Therefore, the display panel 10 may be curvable, bendable, foldable or rollable to be curved, bent, folded or rolled, respectively.

The display panel 10 may include a display area AAR for displaying a screen and a non-display area NAR for not displaying a screen. The display panel 10 may be categorized into the display area AAR and the non-display area NAR on a plane view. The non-display area NAR may be adjacent to the display area AAR such as to surround the display area AAR. The display device 1 and various components or layers thereof may have a display area AAR and a non-display area NAR corresponding to those described for the display panel 10.

Figure 3:
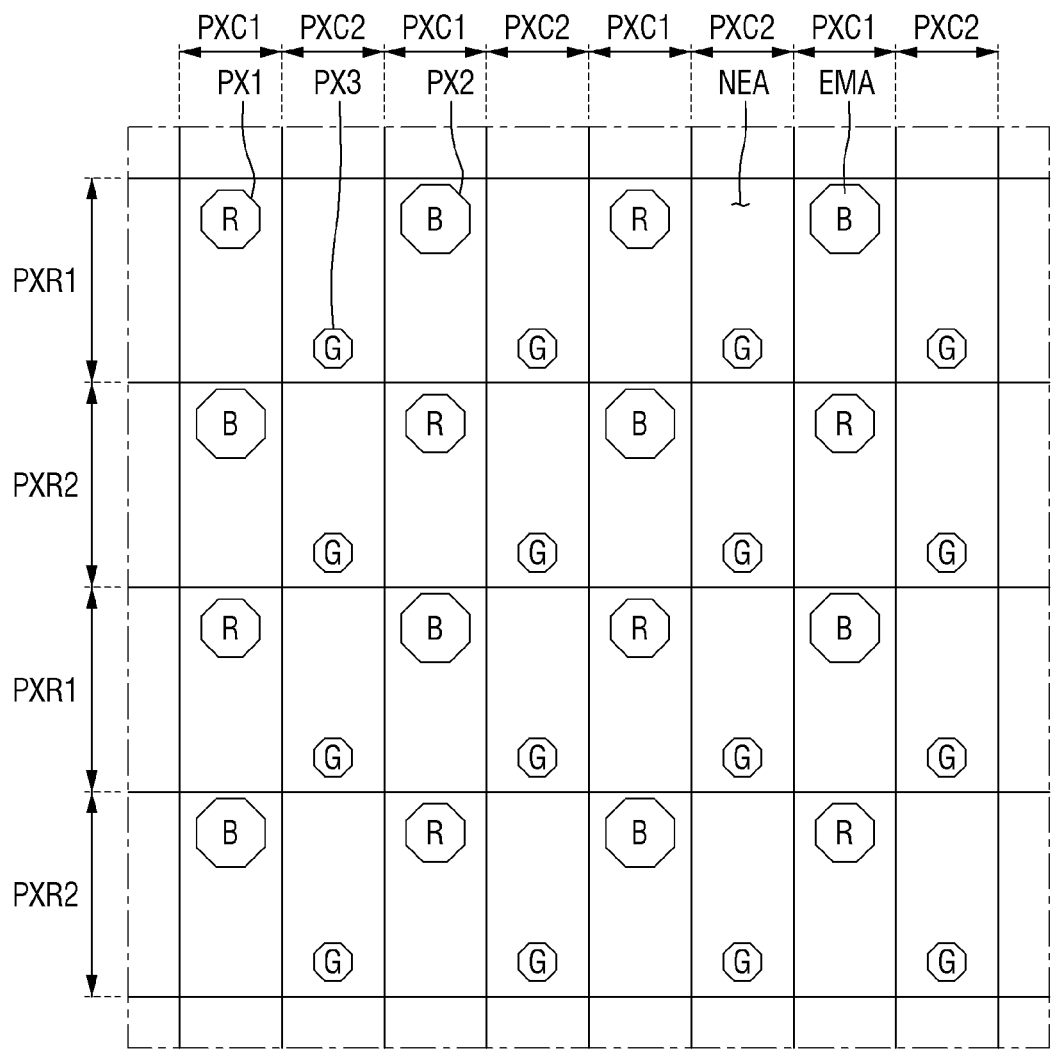
FIG. 3 is a plan view illustrating an embodiment of pixel arrangement of a display device.
Figure 3:
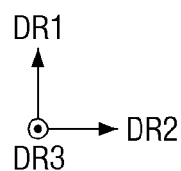

The display area AAR may include a plurality of pixels PX (each of PX1, PX2 and PX3, see FIG. 3). The pixels PX may be arranged in a matrix shape. Each pixel PX may include a light emitting layer 190 (see FIG. 5), and a circuit layer which is controls the amount of light emission by the light emitting layer 190. The circuit layer may include a line, an electrode, and at least one transistor. The light emitting layer 190 may include an organic light emitting material. The light emitting layer 190 (see FIG. 5) may be encapsulated by an encapsulation film. Each pixel PX will later be described in detail.

The display panel 10 may include a main area MR, and a bending area BR which is extended from one side of the main area MR among sides opposing each other along the first direction DR1. The display panel 10 may be bendable at the bending area BR. The display panel 10 may further include a sub area SR extended from one side of the bending area BR among sides opposing each other along the first direction DR1. The display panel 10 which is bent may dispose the sub area SR overlapped with the main area MR along the thickness direction (see FIG. 2).

The main area MR may include the display area AAR and a first portion of the non-display area NAR. A second portion of the non-display area NAR may extend along the first direction DR1 from the first portion of the non-display area NAR to dispose the main area MR, the bending area BR and the sub area SR in order in the first direction DR1.

In a plan view (e.g., view along the third direction DR3 of a plane defined by the first direction DR1 and the second direction DR2 which cross each other), the main area MR may have a shape similar to a shape of the display device 1. The main area MR may be a flat area positioned in one plane but is not limited thereto. At least one of the other edges of the main area MR except an edge (side) connected with the bending area BR may be curved to form a curved side surface, or may be bent in a vertical direction from the plane.

When at least one of the other edges of the main area MR except an edge (side) connected with the bending area BR is curved to form a curved surface or bent, the display area AAR may be disposed even in the corresponding edge among the other edges. However, without limitation to this case, the non-display area NAR at which an image is not displayed may be disposed in the curved surface or bent edge, or the display area AAR and the non-display area NAR may together be disposed therein.

The non-display area NAR of the main area MR may extend from an outer boundary of the display area AAR to an outer edge of the display panel 10. Signal lines or driving circuits for applying a signal to the display area AAR may be disposed in the non-display area NAR of the main area MR.

The bending area BR may be connected with the main area MR through one short side of the main area MR. A width (width along a second direction DR2) of the bending area BR may be smaller than a width (width of a short side) of the main area MR. A transition of the main area MR and the bending area BR may define an L-shape outer edge of the display panel 10 to reduce a width of a bezel.

In the bending area BR, the display panel 10 may be bendable to define a curvature in an opposite direction of a display surface of the display panel 10. The display panel 10 which is bent at the bending area BR may invert a display surface of the display panel 10. That is, one surface of the display panel 10 which is oriented toward an upper portion (e.g., in the third direction DR3), may be oriented toward the outside of a side at the bending area BR (e.g., in a direction opposite to the first direction DR1) and then changed to be oriented toward a lower portion (e.g., in a direction opposite to the third direction DR3).

The sub area SR is extended from the bending area BR to form a distal end of the display panel 10. The display panel 10 which is bent may dispose the sub area SR extended in a direction parallel with the main area MR. The sub area SR may overlap the main area MR in a thickness direction of the display panel 10. The sub area SR may overlap the non-display area NAR of an edge of the main area MR, and may further overlap the display area AAR of the main area MR. Along the second direction DR2, a width of the sub area SR may be equal to that of the bending area BR but is not limited thereto.

A pad portion PDR (see FIG. 6) may be disposed on the sub area SR of the display panel 10. An external device may be packaged in (or attached to) the pad portion PDR. Examples of the external device may include a driving chip 20, and a driving substrate 30 including or made of a flexible printed circuit board or a hard printed circuit board. In addition, a line connection film, a connector, etc. may be packaged in the pad portion PDR as the external device. One external device may be packaged in the sub area SR but a plurality of external devices may be packaged therein. In an embodiment, for example, as illustrated in FIGS. 1 and 2, the driving chip 20 may be disposed in the sub area SR of the display panel 10, and the driving substrate 30 may be attached to an end portion of the sub area SR (e.g., distal end). In this case, the display panel 10 may include both a pad portion PDR connected with the driving chip 20 and a pad portion PDR connected with the driving substrate 30. In an embodiment, a driving chip 20 may be packaged on a film, and the film may be attached to the sub area SR of the display panel 10.

The driving chip 20 is packaged on one surface of the display panel 10, which is the same surface as the display surface (e.g., coplanar with the display surface). However, as described above, the driving chip 20 is packaged on the surface of the display panel 10 which is oriented toward the lower portion in a thickness direction, as the bending area BR is bent and inverted, whereby an upper surface of the driving chip 20 may be oriented toward the lower portion.

The driving chip 20 may be attached onto the display panel 10 through an anisotropic conductive film, or may be attached onto the display panel 10 through ultrasonic bonding. A horizontal width of the driving chip 20 may be smaller than that of the display panel 10. The driving chip 20 may be disposed at a center portion in a horizontal direction (second direction DR2) of the sub area SR, and a left edge and a right edge of the driving chip 20 may respectively be spaced apart from a left edge and a right edge of the sub area SR.

The driving chip 20 may include an integrated circuit for driving the display panel 10. In an embodiment, the integrated circuit may be, but not limited to, a data driving integrated circuit for generating and providing a data signal. The driving chip 20 is connected to a line pad DL_PD provided in plural including a plurality of line pads DL_PD (see FIG. 6) provided in the pad portion PDR of the display panel 10 to provide a data signal to the line pad DL_PD. Conductive lines or signal lines connected to the line pad DL_PD are extended toward the pixels PX to apply a data signal, etc. to each pixel PX.

FIG. 3 is a plan view of an embodiment of a pixel arrangement of a display device 1.

Referring to FIG. 3, the pixels PX may include a first color pixel PX1, a second color pixel PX2, and a third color pixel PX3. In an embodiment, the first color pixel PX1 may be a red pixel, the second color pixel PX2 may be a blue pixel, and the third color pixel PX3 may be a green pixel. The respective pixels PX may alternately be arranged while constituting a matrix.

Each pixel PX may include an emission area EMA and a non-emission area NEA which is adjacent to the emission area EMA such as surrounding the emission area EMA. Sizes of the emission areas EMA in the respective color pixels PX1, PX2 and PX3 may be different from one another. In an embodiment, for example, a size of (e.g., planar area) the emission area EMA of the second color pixel PX2 may be greater than a size of the emission area EMA of the first color pixel PX1, and a size of the emission area EMA of the third color pixel PX3 may be smaller than a size of the emission area EMA of the first color pixel PX1. The emission area EMA of each pixel PX may have, but is not limited to, an octagonal shape. The emission area EMA of each pixel PX may have a planar shape such as a hexagonal shape, a circular shape, a rhombus shape or other polygonal shape, a polygonal shape with rounded corners, etc.

The pixels PX are arranged in a plurality of pixel columns PXC and a plurality of pixel rows PXR. In first pixel columns PXC1 among the plurality of pixel columns PXC, the first color pixel PX1 and the second color pixel PX2 are alternately arranged along the first direction DR1 (column progress direction). In second pixel columns PXC2 among the plurality of pixel columns PXC, the third color pixel PX3 is repeatedly arranged. The first pixel column PXC1 and the second pixel column PXC2 are alternately arranged along the second direction DR2 (row progress direction). In an embodiment, for example, odd numbered pixel columns PXC may be the first pixel columns PXC1, and even numbered pixel columns PXC may be the second pixel columns PXC2.

The respective emission areas EMA that belong to one pixel column may generally be aligned along the first direction DR1. The emission areas EMA of one pixel column PXC may be disposed to be alternate with respect to the emission areas of another pixel column adjacent thereto. In an embodiment, for example, the first color pixel PX1 and the second color pixel PX2 of the first pixel column PXC1 may be disposed to be aligned along the second direction DR2 along a line between third color pixels PX3, which are adjacent to each other, of the second pixel column PXC2 adjacent thereto, and the third color pixel PX3 of the second pixel column PXC2 may be disposed to be aligned along a line along the second direction DR2 between the first color pixel PX1 and the second color pixel PX2, which are adjacent to each other, of the first pixel column PXC1 adjacent thereto. That is, the respective emission areas EMA may be staggered along the first direction DR1.

A pixel row has an area including the first color pixel PX1 and the second color pixel PX2 alternately arranged by interposing the third color pixel PX3. With reference to a same pixel column, a first pixel row PXR1 may have a repeated arrangement unit of the first color pixel PX1, the third color pixel PX3, the second color pixel PX2 and the third color pixel PX3, and a second pixel row PXR2 may have a repeated arrangement unit of the second color pixel PX2, the third color pixel PX3, the first color pixel PX1 and the third color pixel PX3. The first pixel row PXR1 and the second pixel row PXR2 are alternately arranged along the first direction DR1 (column progress direction). In an embodiment, for example, odd numbered pixel rows PXR may be the first pixel rows PXR1, and even numbered pixel rows PXR may be the second pixel rows PXR2. In one pixel row, the emission area EMA of the first color pixel PX1 and the second color pixel PX2 may be disposed to be relatively more inclined toward a same side of the pixel row along the first direction DR1 than the emission area EMA of the third color pixel PX3. That is, in the pixel row, the emission areas EMA of the respective pixels PX may be arranged in a zigzag shape along the second direction DR2.

The pixels PX within a same column may receive a data signal from the same data line DL, and the pixels PX within a same row may receive a gate signal from the same gate line. Each pixel PX may be driven by the pixel circuit. The pixel circuit may include a plurality of transistors and at least one capacitor. A circuit view of an embodiment of a pixel circuit is shown in FIG. 4.

Figure 4:
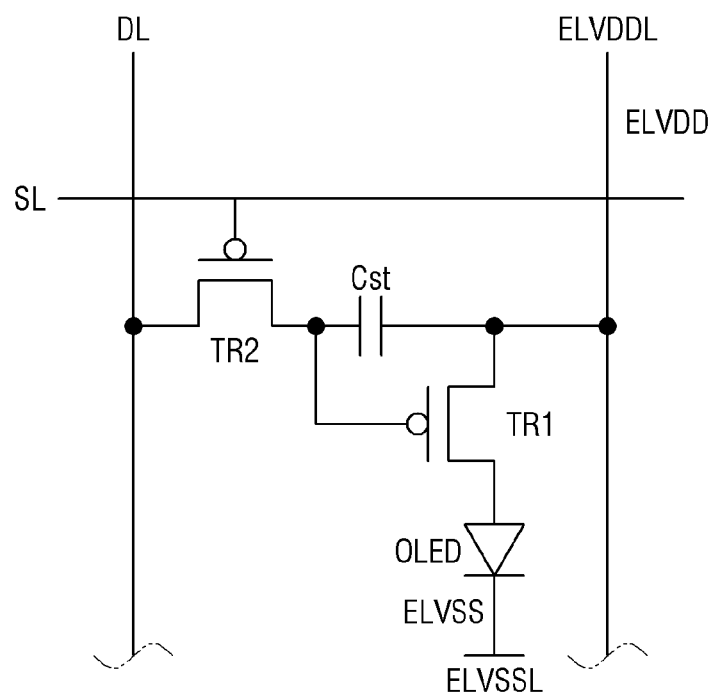
FIG. 4 is a circuit view illustrating an embodiment of a pixel of a display device.

FIG. 4 is a circuit view illustrating an embodiment of one pixel PX of a display device 1.

Referring to FIG. 4, the pixel circuit may include a first transistor TR1, a second transistor TR2, a capacitor Cst, and an organic light emitting diode OLED as a light emitting element. A scan line SL, a data line DL, a first power voltage line ELVDDL and a second power voltage line ELVSSL are connected to each pixel circuit.

The first transistor TR1 may be a driving transistor, and the second transistor TR2 may be a switching transistor. Although the case that the first transistor TR1 and the second transistor TR2 are PMOS transistors is illustrated, any one or both of the first transistor TR1 and the second transistor TR2 may be NMOS transistor(s).

A first electrode (source electrode) of the first transistor TR1 is connected with the first power voltage line ELVDDL, and a second electrode (drain electrode) is connected to a pixel electrode 181 (or anode electrode) of the organic light emitting diode OLED. A first electrode (source electrode) of the second transistor TR2 is connected with the data line DL, and its second electrode (drain electrode) is connected to a gate electrode of the first transistor TR1. The capacitor Cst is connected between the gate electrode and the first electrode of the first transistor TR1. A common electrode 182 (or cathode electrode) of the organic light emitting diode OLED is connected with the second power voltage line ELVSSL, and is supplied with a second power voltage ELVSS from the second power voltage line ELVSSL. That is, the plurality of pixels PX includes light emitting elements which receive the second power voltage ELVSS from the second power voltage line ELVSSL.

The second power voltage ELVSS may be a voltage lower than a first power voltage ELVDD supplied from the first power voltage line ELVDDL. That is, the second power voltage ELVSS and the first power voltage ELVDD may be applied to the pixels PX in the display area AAR.

The second transistor TR2 may output the data signal applied to the data line DL in response to a scan signal applied to the scan line SL. The capacitor Cst may charge a voltage corresponding to the data signal received from the second transistor TR2. The first transistor TR1 may control an electrical driving current (e.g., a driving current) flowing in the organic light emitting diode OLED in response to the amount of charges stored in the capacitor Cst.

The equivalent circuit of FIG. 4 is only an embodiment, and the pixel circuit may include more transistors and capacitors (for example, seven).

Figure 5:
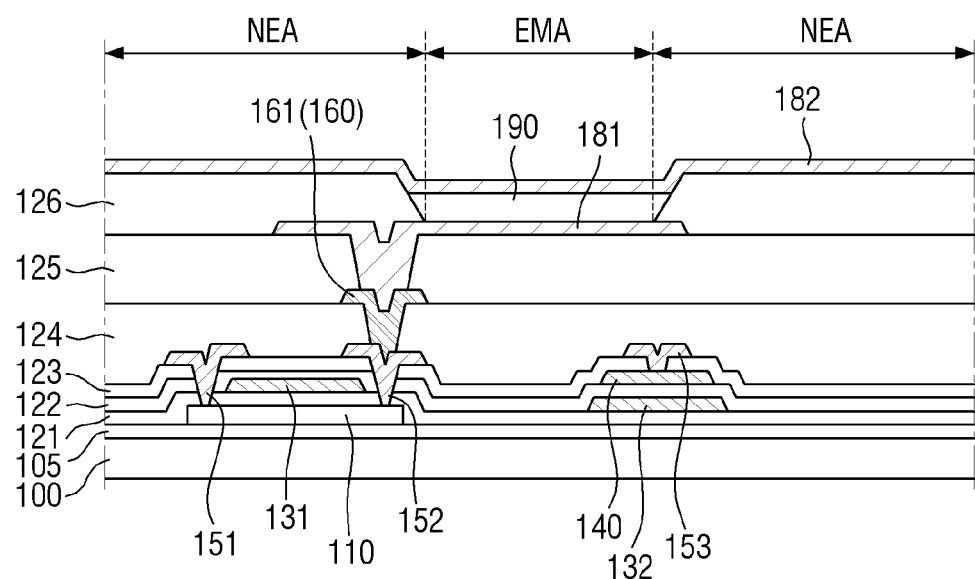
FIG. 5 is a cross-sectional view illustrating an embodiment of a pixel of a display device.

FIG. 5 is a cross-sectional view illustrating an embodiment of one pixel PX of a display device 1. In FIG. 5, the first transistor TR1 among the two transistors of FIG. 4 is shown in the form of a thin film transistor, and the second transistor TR2 is omitted.

A sectional structure of the pixel PX will be described in detail with reference to FIG. 5. The display panel 10 may include a substrate 100, a buffer layer 105, a semiconductor layer 110, a first insulating layer 121, a first gate conductive layer 130, a second insulating layer 122, a second gate conductive layer 140, a third insulating layer 123, a first data conductive layer 150 (e.g., first conductive layer), a fourth insulating layer 124, a second data conductive layer 160 (e.g., second conductive layer), a fifth insulating layer 125, a pixel electrode 181, a pixel definition film 126 including an opening exposing the pixel electrode 181 to outside the pixel definition film 126, a light emitting layer 190 disposed in the opening of the pixel definition film 126, and a common electrode 182 disposed on the light emitting layer 190 and the pixel definition film 126. The aforementioned respective layers may be made of a single film but may be made of a deposition film including a plurality of films. Another layer may further be disposed between the respective layers.

The substrate 100 supports the respective layers disposed thereon. The substrate 100 may be made of an insulating material such as a polymer resin. An example of the polymer material may include polyethersulphone (PES), polyacrylate (PA), polyarylate (PAR), polyetherimide (PEI), polyethylene napthalate (PEN), polyethylene terephthalate (PET), polyphenylene sulfide (PPS), polyallylate, polyimide (PI), polycarbonate (PC), cellulose triacetate (CAT), cellulose acetate propionate (CAP) or a combination. The substrate 100 may be a flexible substrate that is able to be subjected to bending, folding, rolling, etc. An example of a material constituting the flexible substrate may be, but not limited to, polyimide (PI).

The buffer layer 105 is disposed on the substrate 100. The buffer layer 105 may prevent impurity ions from being diffused and reduce or effectively prevent water or external air from being permeated into the substrate 100, and may perform a surface planarization function. The buffer layer 105 may include a silicon nitride, a silicon oxide or a silicon oxynitride. The buffer layer 105 may be omitted depending on types or process conditions of the substrate 100.

The semiconductor layer 110 is disposed on the buffer layer 105. The semiconductor layer 110 constitutes a channel of a thin film transistor of the pixel PX. The semiconductor layer 110 may include polycrystalline silicon but is not limited thereto. The semiconductor layer 110 may include a single crystal silicon, a low temperature a polycrystalline silicon, an amorphous silicon, or an oxide semiconductor. The oxide semiconductor may include, for example, a two-component compound (ABx), a three-component compound (ABxCy), or a four-component compound (ABxCyDz), which contains indium, zinc, gallium, tin, titanium, aluminum, hafnium (Hf), zirconium (Zr), magnesium (Mg), etc.

The first insulating layer 121 may be a gate insulating film having a gate insulating function. The first insulating layer 121 may include a silicon compound, a metal oxide, etc. In an embodiment, for example, the first insulating layer 121 may include a silicon oxide, a silicon nitride, a silicon oxynitride, an aluminum oxide, a tantalum oxide, a hafnium oxide, a zirconium oxide, and a titanium oxide. These oxides may be used alone or by combination. The first insulating layer 121 may be a single film, or a multi-layered film made of deposition films of different materials.

The first insulating layer 121 is disposed on the semiconductor layer 110. The first insulating layer 121 may generally be disposed over an entirety (e.g., an entire surface) of the substrate 100.

The first gate conductive layer 130 is disposed on the first insulating layer 121. The first gate conductive layer 130 may include a plurality of first gate conductive patterns such as a gate electrode 131 of the thin film transistor of the pixel PX, a scan line connected to the gate electrode 131, and a sustain capacitor first electrode 132.

The first gate conductive layer 130 may include one or more metals selected from Mo, Al, Pt, Pd, Ag, Mg, Au, Ni, Nd, Ir, Cr, Ca, Ti, Ta, W, and Cu. The first gate conductive layer 130 may be a single film or a multi-layered film.

The second insulating layer 122 may be disposed on the first gate conductive layer 130. The second insulating layer 122 may be an inter-layer dielectric film or a gate insulating film. The second insulating layer 122 may include an inorganic insulating material such as a silicon oxide, a silicon nitride, a silicon oxynitride, a hafnium oxide, an aluminum oxide, a titanium oxide, a tantalum oxide, and a zinc oxide.

The second gate conductive layer 140 is disposed on the second insulating layer 122. The second gate conductive layer 140 may include a plurality of second gate conductive patterns such as including one or more of a sustain capacitor second electrode.

The second gate conductive layer 140 may include one or more metals selected from Mo, Al, Pt, Pd, Ag, Mg, Au, Ni, Nd, Ir, Cr, Ca, Ti, Ta, W, and Cu. The second gate conductive layer 140 may be made of the same material as that of the first gate conductive layer 130 but is not limited thereto. The second gate conductive layer 140 may be a single film or a multi-layered film.

The third insulating layer 123 is disposed on the second gate conductive layer 140. The third insulating layer 123 may be an inter-layer dielectric film. The third insulating layer 123 may include an inorganic insulating material such as a silicon oxide, a silicon nitride, a silicon oxynitride, a hafnium oxide, an aluminum oxide, a titanium oxide, a tantalum oxide, and a zinc oxide, or an organic insulating material such as polyacrylates resin, epoxy resin, phenolic resin, polyamides resin, polyimides resin, unsaturated polyesters resin, poly phenylenethers resin, polyphenylenesulfides resin or benzocyclobutene (BCB). The third insulating layer 123 may be a single film, or a multi-layered film made of deposition films of different materials.

The first data conductive layer 150 is disposed on the third insulating layer 123. The first data conductive layer 150 may be a first source/drain conductive layer. The first data conductive layer 150 may include a plurality of first data conductive patterns such as a first electrode 151 and a second electrode 152 of the thin film transistor of the pixel PX. The first electrode 151 and the second electrode 152 of the thin film transistor may be electrically connected with a source area and a drain area of the semiconductor layer 110, through contact holes that pass through the third insulating layer 123, the second insulating layer 122 and the first insulating layer 121, respectively. The first power voltage electrode 153 of the pixel PX may also be a pattern of the first data conductive layer 150.

The first data conductive layer 150 may include one or more metals selected from Al, Mo, Pt, Pd, Ag, Mg, Au, Ni, Nd, Ir, Cr, Ca, Ti, Ta, W, and Cu. The first data conductive layer 150 may be a single film or a multi-layered film. In an embodiment, for example, the first data conductive layer 150 may be formed of a deposition structure of Ti/Al/Ti, Mo/Al/Mo, Mo/AlGe/Mo, Ti/Cu, etc.

The fourth insulating layer 124 is disposed on the first data conductive layer 150. The fourth insulating layer 124 covers the first data conductive layer 150. The fourth insulating layer 124 may be an inter-layer dielectric film or a via layer. The fourth insulating layer 124 may include an organic insulating material such as polyacrylates resin, epoxy resin, phenolic resin, polyamides resin, polyimides resin, unsaturated polyesters resin, poly phenylenethers resin, polyphenylenesulfides resin or benzocyclobutene (BCB).

The second data conductive layer 160 is disposed on the fourth insulating layer 124. The second data conductive layer 160 may be a second source/drain conductive layer. The second data conductive layer 160 may include a plurality of second data conductive patterns such as one or more of an anode connection electrode 161 of the pixel PX. The anode connection electrode 161 may be electrically connected with the second electrode 152 of the thin film transistor of the pixel PX through a contact hole that passes through the fourth insulating layer 124.

The second data conductive layer 160 may include one or more metals selected from Al, Mo, Pt, Pd, Ag, Mg, Au, Ni, Nd, Ir, Cr, Ca, Ti, Ta, W, and Cu. The second data conductive layer 160 may be a single film or a multi-layered film. In an embodiment, for example, the second data conductive layer 160 may be formed of, but not limited to, the same material as that of the first data conductive layer 150.

The fifth insulating layer 125 is disposed on the second data conductive layer 160. The fifth insulating layer 125 covers the second data conductive layer 160. The fifth insulating layer 125 may be a via layer. The fifth insulating layer 125 may include the same material as that of the fourth insulating layer 124, or may include one or more materials selected from the exemplified materials of the fourth insulating layer 124.

The pixel electrode 181 is disposed on the fifth insulating layer 125. The pixel electrode 181 may be an anode electrode of the light emitting element. The pixel electrode 181 may be electrically connected with the anode connection electrode 161 of the second data conductive layer 160 through a contact hole that passes through the fifth insulating layer 125, and may be connected with the second electrode 152 of the thin film transistor through the anode connection electrode 161. The pixel electrode 181 may partially overlap or correspond to the emission area EMA of the pixel PX.

The pixel electrode 181 may have a deposition film structure of a material layer having a high work function such as Indium-Tin-Oxide (ITO), Indium-Zinc-Oxide (IZO), Zinc Oxide (ZnO), and Indium Oxide ($In_2O_3$) and a reflective material layer such as Ag, Mg, Al, Pt, Pb, Au, Ni, Nd, Ir, Cr, Li, Ca or a compound thereof. The material layer having a high work function may be disposed to be higher than the reflective material layer (e.g., further from the substrate 100 than the reflective material layer along a thickness direction) and thus disposed to be closer to the light emitting layer 190 than the reflective material layer. The pixel electrode 181 may have a multi-layered structure of ITO/Mg, ITO/MgF, ITO/Ag, and ITO/Ag/ITO, but is not limited thereto.

The pixel definition film 126 may be disposed on the pixel electrode 181. The pixel definition film 126 may partially overlap the non-emission area NEA of the pixel PX. The pixel definition film 126 may include an opening that exposes the pixel electrode 181 to outside the pixel definition film 126. The pixel definition film 126 may include an inorganic insulating material such as a silicon oxide, a silicon nitride, a silicon oxynitride, a hafnium oxide, an aluminum oxide, a titanium oxide, a tantalum oxide, and a zinc oxide, or an organic insulating material such as polyacrylates resin, epoxy resin, phenolic resin, polyamides resin, polyimides resin, unsaturated polyesters resin, poly phenylenethers resin, polyphenylenesulfides resin or benzocyclobutene (BCB). The pixel definition film 126 may be a single film, or a multi-layered film made of deposition films of different materials.

The light emitting layer 190 is disposed in the opening of the pixel definition film 126. The light emitting layer 190 may be made of an inorganic material or an organic material. In an embodiment, the light emitting layer 190 may include an organic layer. The light emitting layer 190 may include an organic light emitting layer, a hole injecting/transporting layer, and an electron injecting/transporting layer. The light emitting layer 190 may overlap the emission area EMA.

The common electrode 182 is disposed on the light emitting layer 190 and the pixel definition film 126. The common electrode 182 may be a cathode electrode of the light emitting diode. The common electrode 182 may be disposed in the non-emission area NEA as well as the emission area EMA of the pixel PX. That is, the common electrode 182 may be disposed in an entirety of each pixel PX (e.g., common to a plurality of pixels PX). The common electrode 182 may include a material layer having a low work function such as Li, Ca, LiF/Ca, LiF/Al, Al, Mg, Ag, Pt, Pd, Ni, Au Nd, Ir, Cr, BaF, Ba or a combination thereof (for example, combination of Ag and Mg). The common electrode 182 may further include a transparent metal oxide layer disposed on the material layer having a low work function.

Although not shown, an encapsulation film may be disposed on the common electrode 182. The encapsulation film may include an inorganic film. In an embodiment, the encapsulation film may include a first inorganic film, an organic film on the first inorganic film, and a second inorganic film on the organic film.

Figure 6:
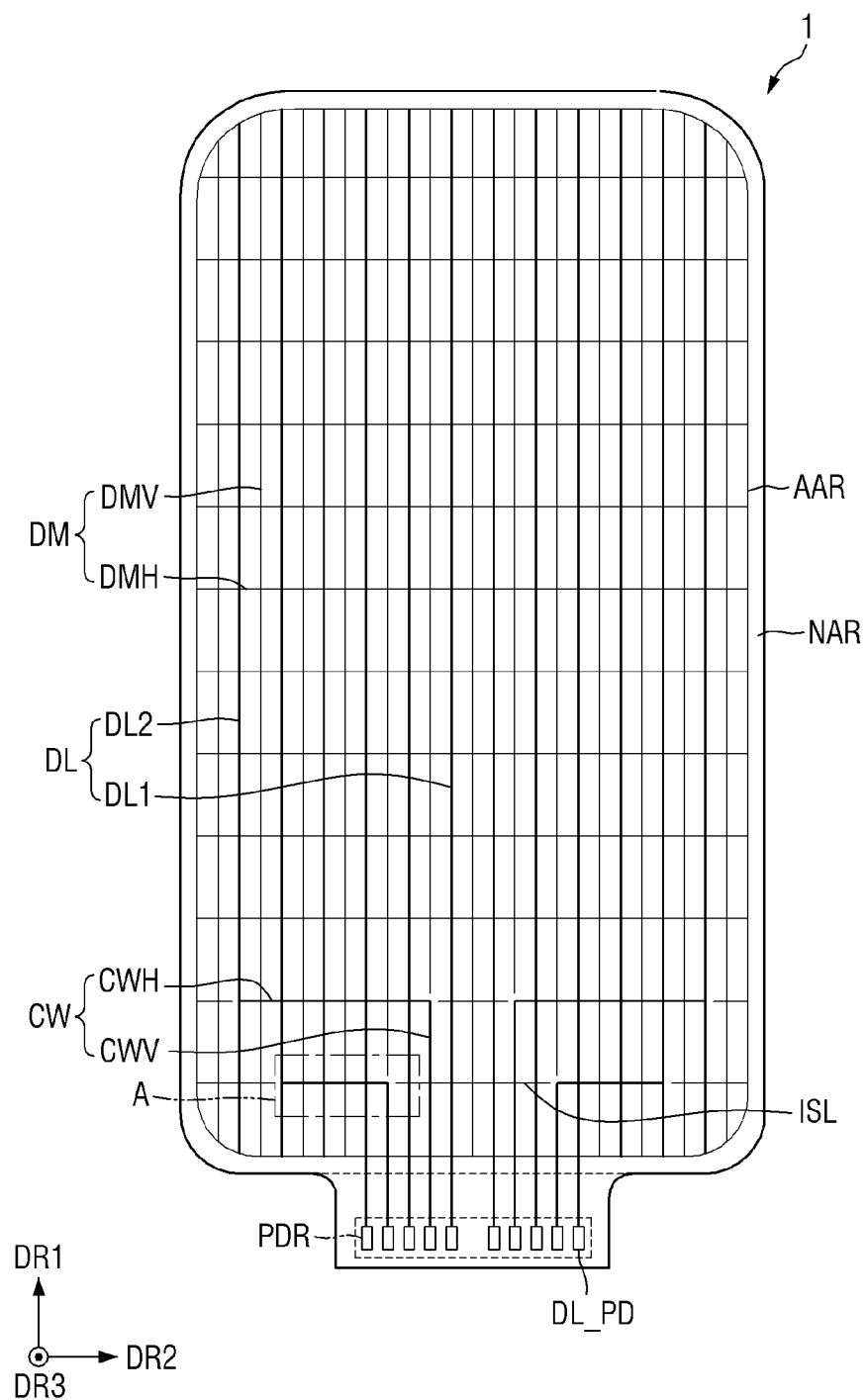
FIG. 6 is a schematic plan view illustrating an embodiment of a data line, a connection line and a constant voltage line.
Figure 7:
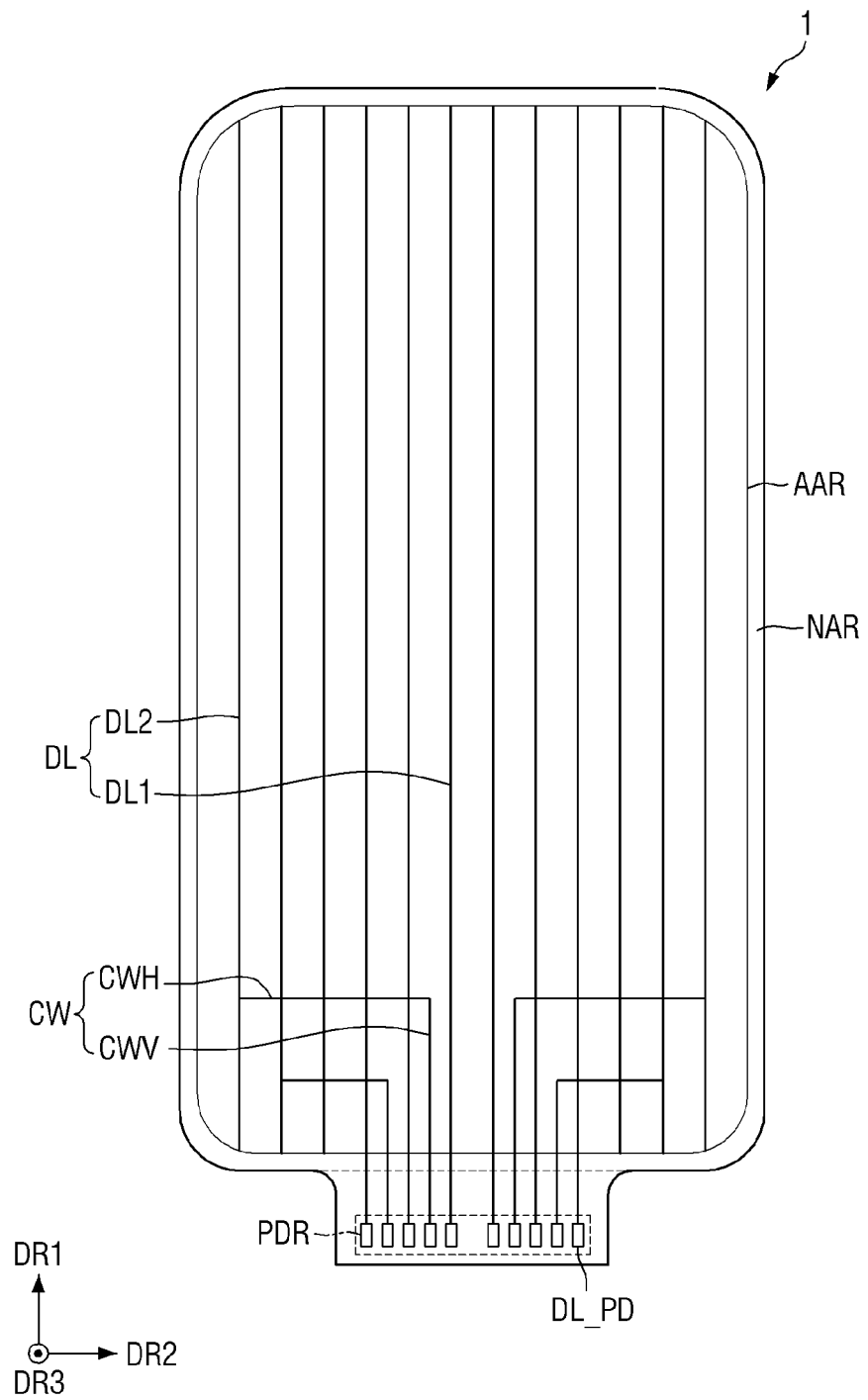
FIG. 7 is a schematic plan view illustrating an embodiment of the data line and the connection line of FIG. 6.
Figure 8:
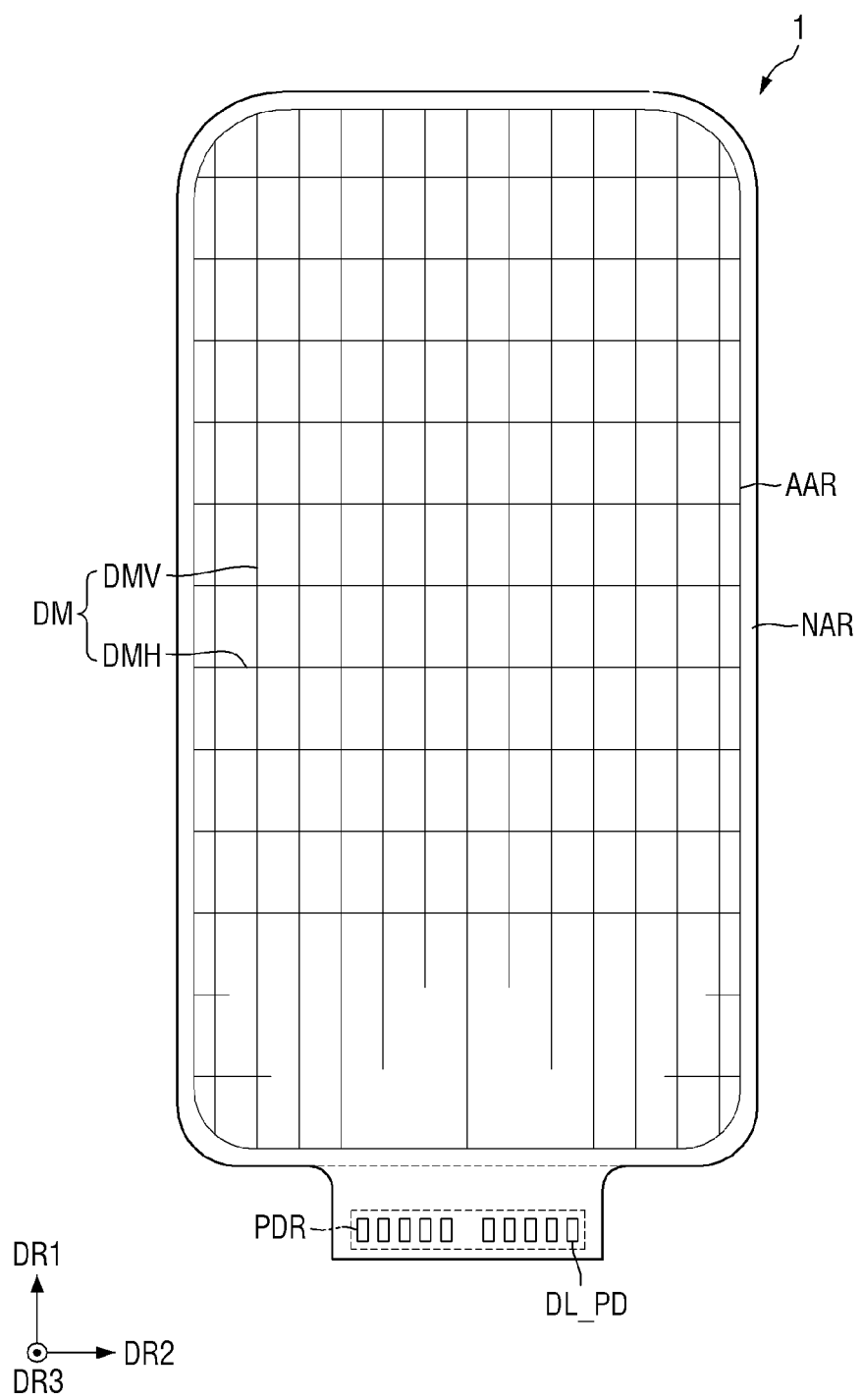
FIG. 8 is a schematic plan view illustrating an embodiment of the constant voltage line of FIG. 6.
Figure 9:
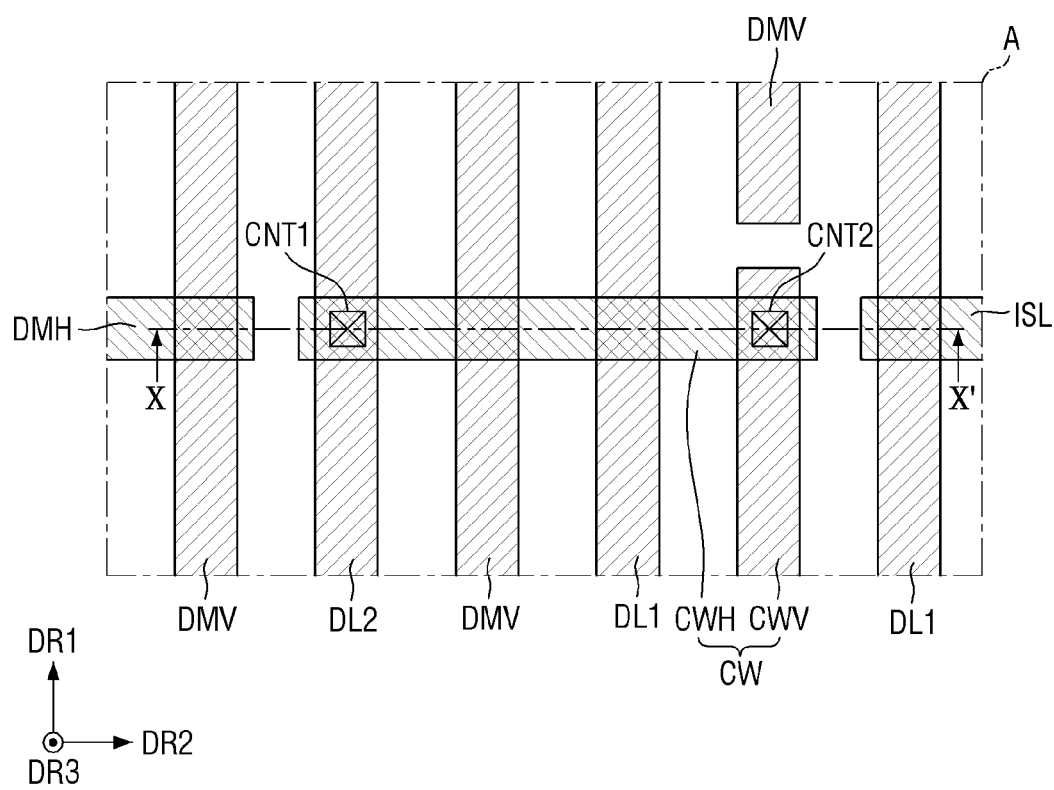
FIG. 9 is an enlarged view illustrating area A of FIG. 6.
Figure 10:
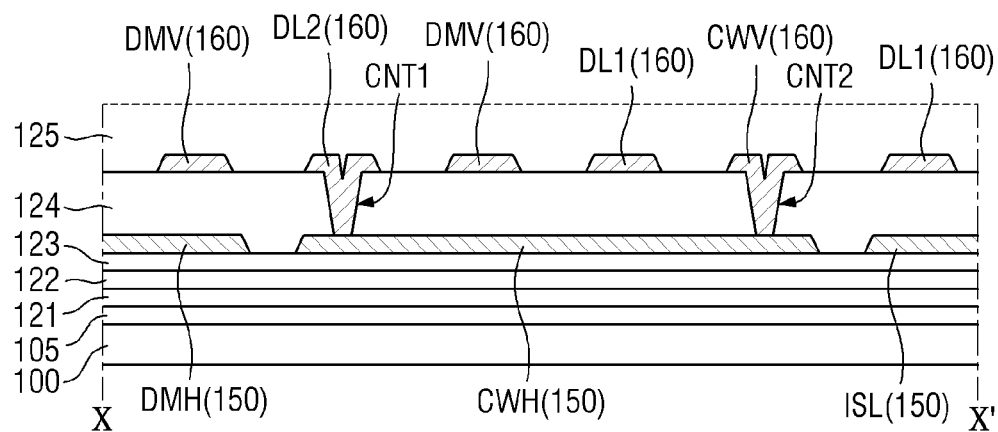
FIG. 10 is a cross-sectional view taken along line X-X' of FIG. 9.
Figure 10:
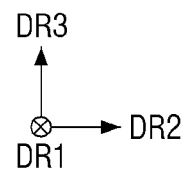

FIG. 6 is a schematic plan view illustrating a data line DL, a connection line CW and a constant voltage line DM. FIG. 7 is a schematic plan view illustrating an embodiment of the data line DL and the connection line CW of FIG. 6. FIG. 8 is a schematic plan view illustrating an embodiment of the constant voltage line DM of FIG. 6. FIG. 9 is an enlarged plan view illustrating an embodiment of area A of FIG. 6. FIG. 10 is a cross-sectional view taken along line X-X' of FIG. 9.

Referring to FIGS. 6 to 10, the display device 1 may include a plurality of data lines DL respectively extended in the first direction DR1 and arranged along the second direction DR2, a connection line CW electrically connected with the data lines DL and a line pad DL_PD of the pad portion PDR, and a constant voltage line DM to which a constant voltage is applied. The data line DL may be a pattern of the second data conductive layer 160.

The data lines DL may include a first data line DL1 and a second data line DL2. Each of the first data line DL1 and the second data line DL2 may be provided in a plural number. The first data line DL1 may be directly connected with the line pad DL_PD of the pad portion PDR (e.g., a first line pad), and the second data line DL2 may be electrically connected with the line pad DL_PD of the pad portion PDR (e.g., a second line pad) through the connection line CW. That is, the connection line CW electrically connects a portion of the plurality of data lines DL with a portion of the plurality of line pads DL_PD. Although not limited thereto, based on the second direction DR2, the first data line DL1 may be disposed in the vicinity of the center of the display device 1 (e.g., further from the non-display area NAR than the second data line DL2), and the second data line DL2 may be disposed in an outer vicinity of the display device 1 (e.g., closer to the non-display area NAR than the first data line DL1). In an embodiment, for example, the first data line DL1 may be extended from the line pad DL_PD of the pad portion PDR in the first direction DR1, and the second data line DL2 may be disposed at one side and the other side of the first data line DL1 which oppose each other along the second direction DR2.

The connection line CW may be disposed between the second data line DL2 and the line pad DL_PD of the pad portion PDR. The connection line CW may be provided in a plural number. Each of the plurality of connection lines CW may include a first connection line CWV extended in the first direction DR1 and a second connection line CWH extended in the second direction DR2. The first connection line CWV and the second connection line CWH of each of the plurality of connection lines CW may be electrically connected with each other. A first end of the first connection line CWV may be electrically connected with the line pad DL_PD of the pad portion PDR, and a second end which is opposite to the first end of the first connection line CWV may be electrically connected with the second connection line CWH. A first end of the second connection line CWH may be electrically connected with the first connection line CWV, and a second end which is opposite to the first end of the second connection line CWH may be electrically connected with the second data line DL2. That is, the second data line DL2 may be electrically connected with the line pad DL_PD of the pad portion PDR, through the connection line CW.

The first connection line CWV and the second connection line CWH may be respective patterns of different conductive layers. In an embodiment, for example, the first connection line CWV may be a second data conductive pattern of the second data conductive layer 160 and the second connection line CWH may be a first data conductive pattern of the first data conductive layer 150, but the connection lines CW are not limited thereto. In this case, even though the second connection line CWH crosses the data line DL in a plan view, the second connection line CWH and the data line DL may be electrically insulated from each other through the fourth insulating layer 124.

Even though the first connection line CWV and the second connection line CWH are respective conductive patterns of conductive layers different from each other, the first connection line CWV and the second connection line CWH may be electrically connected with each other through a second contact hole CNT2 that passes through the fourth insulating layer 124. Even though the first connection line CWV and the second connection line CWH are respective conductive patterns of conductive layers different from each other, the first connection line CWV and the second data line DL2 may be electrically connected with each other through a first contact hole CNT1 that passes through the fourth insulating layer 124.

At least a portion of the connection line CW may be disposed in the display area AAR. The portion at the first contact hole CNT1 where the second data line DL2 and the connection line CW are electrically connected with each other may be disposed in the display area AAR. That is, the connection line CW and the second data line DL2 contact each other in the display area AAR. At least a portion of the connection line CW for electrically connecting the line pad DL_PD of the pad portion PDR with the second data line DL2 may be disposed in the display area AAR. As the connection line CW does not bypass the non-display area NAR and at least a portion of the connection line CW is disposed in the display area AAR, a width of the non-display area NAR may be reduced, whereby a user viewing an image displayed in the display area AAR may be supplied with more improved immersion, and the other conductive lines disposed in the non-display area NAR may be disposed more easily.

In embodiments, the connection line CW and the second data line DL2 may contact each other in the non-display area NAR, and thus may be electrically connected with each other. In this case, a separate conductive pattern for electrically connecting the connection line CW with the second data line DL2 may further be disposed in the non-display area NAR. As being in contact, elements may form an interface or boundary therebetween without being limited thereto.

The display device 1 may further include a separation pattern ISL. The separation pattern ISL may be separated from the connection line CW and the constant voltage line DM, and may be electrically insulated therefrom. The separation pattern ISL may include an island shape. The separation pattern ISL may be extended in the second direction DR2, and may be disposed between the connection lines CW. The separation pattern ISL may be disposed between the second connection lines CWH adjacent to each other in the second direction DR2, and may be disposed on an extension line (e.g., a virtual extension line, see FIG. 6) of the second connection line CWH. The separation pattern ISL may be a first data conductive pattern of the first data conductive layer 150.

The constant voltage line DM may include a first constant voltage line DMV extended in the first direction DR1 and a second constant voltage line DMH extended in the second direction DR2. Each of the first constant voltage line DMV and the second constant voltage line DMH may be provided in a plural number, and the plurality of first constant voltage lines DMV may be arranged in the second direction DR2, and the plurality of second constant voltage lines DMH may be arranged in the first direction DR1.

The constant voltage line DM may be separated or spaced apart from the connection line CW and the data line DL, and maybe electrically insulated therefrom. The constant voltage line DM may be extended in the same direction as that of the connection line CW, or may be disposed to be placed on the extension line of the connection line CW. In other words, at least a portion of the plurality of first constant voltage lines DMV may be extended in the first direction DR1 along which the first connection line CWV is extended, and may be disposed to be placed on the extension line of the first connection line CWV (see FIG. 9). At least a portion of the plurality of second constant voltage lines DMH may be extended in the second direction DR2 along which the second connection line CWH is extended, and may be disposed to be placed on the extension line of the second connection line CWH (see FIG. 9). The plurality of data lines DL are spaced apart from each of the plurality of first constant voltage lines DMV and each of the plurality of second constant voltage lines DMH.

The first constant voltage line DMV disposed on the extension line of the first connection line CWV may be separated or spaced apart from the first connection line CWV in a direction along the substrate 100, and may be electrically insulated therefrom. At least a portion of the plurality of second constant voltage lines DMH may be extended in the second direction along which the second connection line CWH is extended, and may be disposed to be placed on the extension line of the second connection line CWH. The second constant voltage line DMH disposed on the extension line of the second connection line CWH may be separated or spaced apart from the second connection line CWH in a direction along the substrate 100, and may be electrically insulated therefrom. That is, a first constant voltage line DMV among the plurality of first constant voltage lines DMV and the first connection line CWV are arranged along a same extension line, and a second constant voltage line DMH among the plurality of second constant voltage lines DMH and the second connection line CWH are arranged along a same extension line.

When the first constant voltage line DMV is disposed on the extension line of the first connection line CWV, a length of the first constant voltage line DMV may be varied depending on a length of the first connection line CWV. In an embodiment, for example, the length of the first constant voltage line DMV positioned on the extension line of the first connection line CWV of which length is relatively short, may be relatively long. When the second constant voltage line DMH is disposed on the extension line of the second connection line CWH, the second constant voltage lines DMH separated from each other may be positioned on the extension line of one second connection line CWH. In other words, the second connection line CWH may be positioned between the second constant voltage lines DMH separated from each other. In this case, the length of the second constant voltage line DMH may be varied depending on the length of the second connection line CWH. In an embodiment, for example, the length of the second constant voltage line DMH positioned on the extension line of the second connection line CWH of which length is relatively short may be relatively long.

The first constant voltage line DMV and the second constant voltage line DMH may be respective patterns of conductive layers different from each other to be in different layers from each other. The first constant voltage line DMV may be a pattern of a same material layer as that of the first connection line CWV, and the second constant voltage line DMH may be a pattern of a same material layer as that of the second connection line CWH. Elements which are respective patterns of a same material layer are considered in a same layer as each other. In an embodiment, for example, the first constant voltage line DMV may be second data conductive pattern of the second data conductive layer 160 and the second constant voltage line DMH may be a first data conductive pattern of the first data conductive layer 150, but the voltage lines are not limited thereto. In this case, even though the second constant voltage line DMH crosses the data line DL and/or the first constant voltage line DMV, the second constant voltage line DMH and the data line DL and/or the first constant voltage line DMV may be electrically insulated from each other by the fourth insulating layer 124.

Also, the first constant voltage line DMV may be disposed on the same layer as the first connection line CWV, and the second constant voltage line DMH may be disposed on the same layer as the second connection line CWH. In an embodiment, for example, the first constant voltage line DMV may be directly disposed on the fourth insulating layer 124 together with the first connection line CWV, and the second constant voltage line DMH may be directly disposed on the third insulating layer 123 together with the second connection line CWH. However, the constant voltage lines are not limited to this example.

The display device 1 may further include a mesh pattern in the display area AAR. The mesh pattern may include the constant voltage line DM and the connection line CW. In other words, the constant voltage line DM and the connection line CW may constitute the mesh pattern over the entire area of the display area AAR. In the display area AAR, the constant voltage line DM is disposed on the area in which the connection line CW is not disposed, whereby the mesh pattern may be disposed over the entire area of the display area AAR. Therefore, visibility of the connection line CW in the display area AAR may be suppressed or effectively prevented.

A constant voltage may be applied to the constant voltage line DM. The constant voltage may be at least one of a first power voltage ELVDD (see FIG. 4) or a second power voltage ELVSS (see FIG. 4). In an embodiment, the plurality of pixels PX includes light emitting elements which receive the constant voltage (e.g., the second power voltage ELVSS) from the constant voltage line DM. In embodiments, different constant voltages may be applied to respective areas of the constant voltage line DM. In this case, two areas to which respective constant voltages different from each other are applied may be electrically insulated from each other.

When the second power voltage ELVSS (see FIG. 4) is applied to the constant voltage line DM, a current (e.g., electrical current) of the second power voltage line ELVSSL (see FIG. 4) may be dispersed, and heat emission of the second power voltage line ELVSSL (see FIG. 4) may be suppressed or effectively prevented. Moreover, voltage drop (IR drop) of a driving voltage may be suppressed or effectively prevented, whereby the display device 1 may be driven more actively.

The plurality of first constant voltage lines DMV may overlap the plurality of second constant voltage lines DMH along a thickness direction. In an overlap area OA (see FIG. 11), the first constant voltage line DMV may cross the second constant voltage line DMH. In the area where the first constant voltage line DMV and the second constant voltage line DMH overlap each other, the first constant voltage line DMV and the second constant voltage line DMH may be electrically connected with each other. Therefore, the current of the second power voltage line ELVSSL (see FIG. 4) may be dispersed over the first constant voltage line DMV and the second constant voltage line DMH, whereby heat emission of the second power voltage line ELVSSL (see FIG. 4) and voltage drop (IR drop) of the driving voltage may be suppressed or effectively prevented.

In at least a portion of the areas where the plurality of first constant voltage lines DMV overlap the plurality of second constant voltage lines DMH, the first constant voltage line DMV and the second constant voltage line DMH may be electrically insulated from each other. Therefore, visibility of a pattern based on a contact between the first constant voltage line DMV and the second constant voltage line DMH may be suppressed or effectively prevented.

Figure 11:
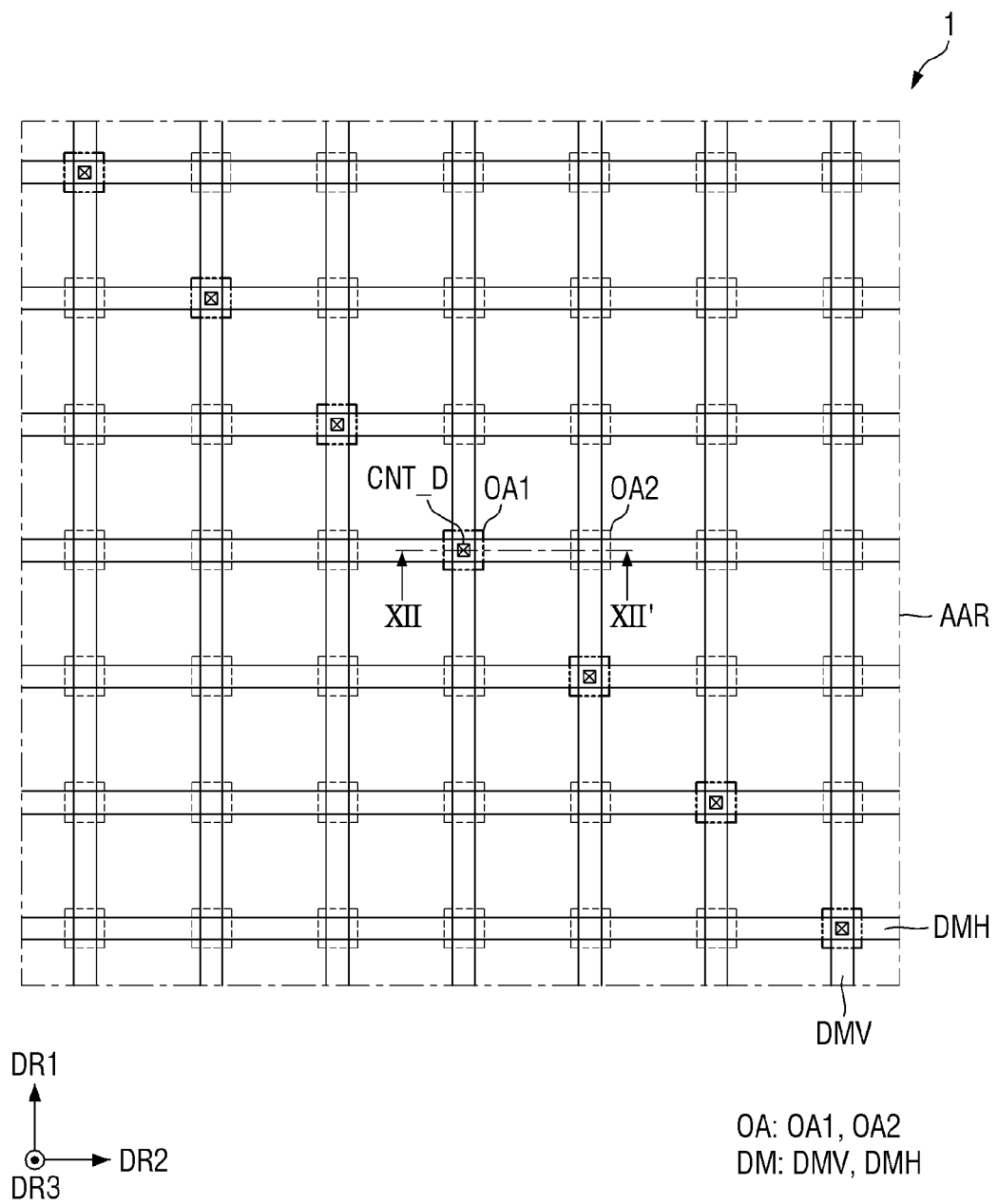
FIG. 11 is an enlarged plan view illustrating an embodiment of a constant voltage line.
Figure 12:
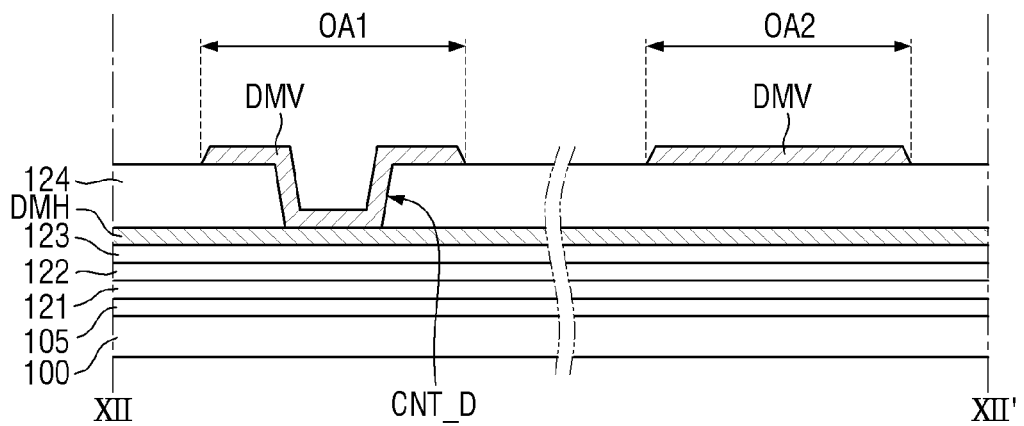
FIG. 12 is a sectional view taken along line XII-XII' of FIG. 11.
Figure 12:
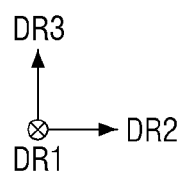

FIG. 11 is an enlarged plan view illustrating an embodiment of a constant voltage line DM. FIG. 12 is a sectional view taken along line XII-XII' of FIG. 11.

Referring to FIGS. 11 and 12, in at least a portion of the areas where the plurality of first constant voltage lines DMV overlap the plurality of second constant voltage lines DMH, the first constant voltage line DMV and the second constant voltage line DMH may be electrically connected with each other. In the other portion (e.g., a remaining portion) of the areas where the plurality of first constant voltage lines DMV overlap the plurality of second constant voltage lines DMH, the first constant voltage line DMV and the second constant voltage line DMH may be electrically insulated from each other.

In detail, the display device 1 may further include an overlap area OA where the first constant voltage line DMV and the second constant voltage line DMH overlap each other. The overlap area OA may be disposed in the display area AAR. In the overlap area OA, the first constant voltage line DMV and the second constant voltage line DMH may cross each other. The overlap area OA may be provided in a plural number. In at least a portion of the plurality of overlap areas OA, the first constant voltage line DMV and the second constant voltage line DMH may be electrically insulated from each other.

The overlap area OA may include a first overlap area OA1 where the first constant voltage line DMV and the second constant voltage line DMH are electrically connected with each other, and a second overlap area OA2 where the first constant voltage line DMV and the second constant voltage line DMH are electrically insulated from each other. That is, the constant voltage line DM includes a plurality of first overlap areas OA1 in which the plurality of first constant voltage lines DMV and the plurality of second constant voltage lines DMH respectively overlap and contact each other, and a plurality of second overlap areas OA2 in which the plurality of first constant voltage lines DMV and the plurality of second constant voltage lines DMH respectively overlap and are insulated from each other. The first overlap area OA1 and the second overlap area OA2 may be provided in a plural number.

In the first overlap area OA1, the first constant voltage line DMV and the second constant voltage line DMH may overlap each other in a thickness direction (third direction DR3), and the first constant voltage line DMV and the second constant voltage line DMH may cross each other on the plane. In the first overlap area OA1, the first constant voltage line DMV and the second constant voltage line DMH may contact each other through a third contact hole CNT_D that exposes the second constant voltage line DMH to outside the fourth insulating layer 124, by passing through the fourth insulating layer 124. That is, in the first overlap area OA1, the first constant voltage line DMV and the second constant voltage line DMH may physically and/or be electrically connected with each other at the third contact hole CNT_D.

In the second overlap area OA2, the first constant voltage line DMV and the second constant voltage line DMH may overlap each other in a thickness direction (third direction DR3), and the first constant voltage line DMV and the second constant voltage line DMH may cross each other on the plane. In the second overlap area OA2, the fourth insulating layer 124 may be disposed between the first constant voltage line DMV and the second constant voltage line DMH based on the thickness direction (third direction DR3). In the second overlap area OA2, the first constant voltage line DMV and the second constant voltage line DMH may be electrically insulated from each other by the fourth insulating layer 124.

The first overlap area OA1 and the second overlap area OA2 may be disposed in a specific pattern on the plane. Referring to FIG. 11, for example, the first overlap area OA1 may be arranged in a direction inclined with respect to the first direction DR1 and the second direction DR2 on the plane. Each of the plurality of first constant voltage lines DMV may be electrically connected with at least one second constant voltage line DMH, and each of the plurality of second constant voltage lines DMH may be electrically connected with at least one first constant voltage line DMV. One of the plurality of first constant voltage lines DMV may be electrically connected with one of the plurality of second constant voltage lines DMH, such as in one-to-one correspondence. In an embodiment, for example, one first constant voltage line DMV may be electrically connected with one second constant voltage line DMH, and the one first constant voltage line DMV may be electrically insulated from the another second constant voltage lines DMH except for the second constant voltage line DMH connected to the one first constant voltage line DMV. However, the first constant voltage line DMV is not limited to this example.

The first overlap area OA1 and the second overlap area OA2, which are shown in FIG. 11, may repeatedly be arranged along the first direction DR1 or the second direction DR2 in accordance with the number of the first constant voltage lines DMV and the number of the second constant voltage lines DMH.

When the first constant voltage line DMV and the second constant voltage line DMH contact each other at the third contact hole CNT_D, a step difference may occur in the first constant voltage line DMV in the thickness direction (third direction DR3) by the third contact hole CNT_D. When external light enters the step difference portion of the first constant voltage line DMV, the step difference portion of the first constant voltage line DMV may be visible by diffused reflection, etc. However, in the second overlap area OA2 where the first constant voltage line DMV and the second constant voltage line DMH are electrically insulated from each other, the step difference portion of the first constant voltage line DMV does not occur, whereby the diffused reflection may be suppressed or effectively prevented.

Therefore, in the first overlap area OA1 where the first constant voltage line DMV and the second constant voltage line DMH are electrically connected with each other, the current applied to the constant voltage line DM may be dispersed to the first constant voltage line DMV and the second constant voltage line DMH, whereby the heat emission issue and the voltage drop (IR drop) problem of the driving voltage may be suppressed or effectively prevented. Also, in the second overlap area OA2 where the first constant voltage line DMV and the second constant voltage line DMH are electrically insulated from each other, the number of the step difference portions that may occur in the first constant voltage line DMV may be reduced, whereby visibility of the step difference portion of the first constant voltage line DMV may be suppressed or effectively prevented.

Hereinafter, embodiments will be described. In the following embodiments, the same elements as those of the above-described embodiments will be omitted or briefly described, or will be described based on a difference from those of the above-described embodiments.

Figure 13:
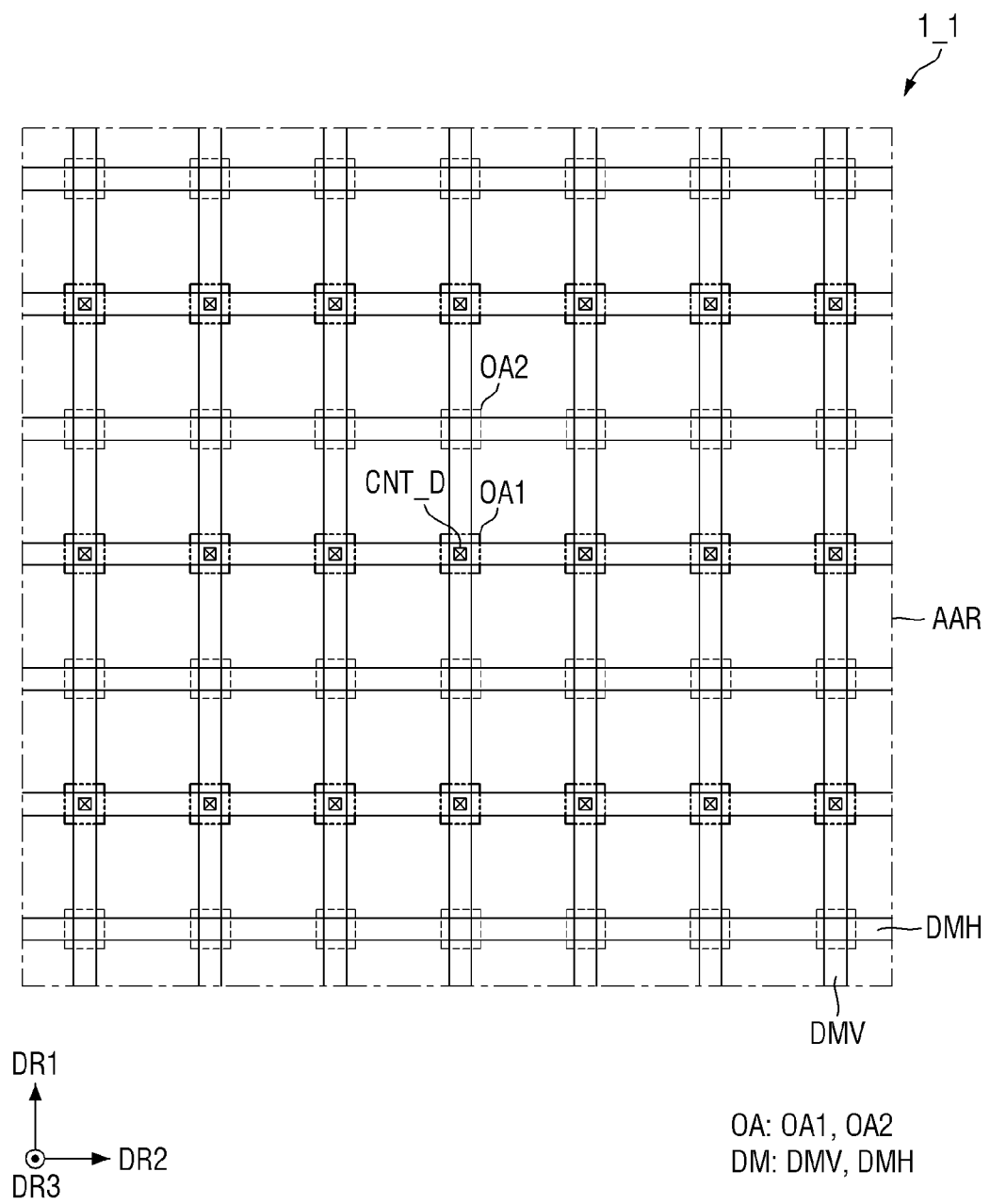
FIG. 13 is an enlarged plan view illustrating an embodiment of a constant voltage line.

FIG. 13 is an enlarged plan view illustrating an embodiment of a constant voltage line DM.

Referring to FIG. 13, a plurality of first overlap areas OA1 in a display device 1_1 are continuously disposed in the second direction DR2 and the first overlap areas OA1 and a plurality of second overlap areas OA2 are alternatingly disposed in the first direction DR1. Each of the first overlap areas OA1 and the second overlap areas OA2 of the display device 1_1 may be disposed per area where the first constant voltage line DMV and the second constant voltage line DMH overlap each other, along the second direction DR2. The first overlap area OA1 and the second overlap area OA2 may be disposed along the first direction DR1 alternately and repeatedly. That is, a single second constant voltage line DMH is connected to a plurality of first constant voltage lines DMV.

Even in this case, the first constant voltage line DMV and the second constant voltage line DMH may be electrically connected with each other to disperse a current, and the first constant voltage line DMV and the second constant voltage line DMH are electrically insulated from each other in some portions (second overlap areas OA2) of the area where the first constant voltage line DMV and the second constant voltage line DMH overlap each other, whereby a visible defect of the first constant voltage line DMV, which is caused by diffused reflection, may be suppressed or effectively prevented.

Figure 14:
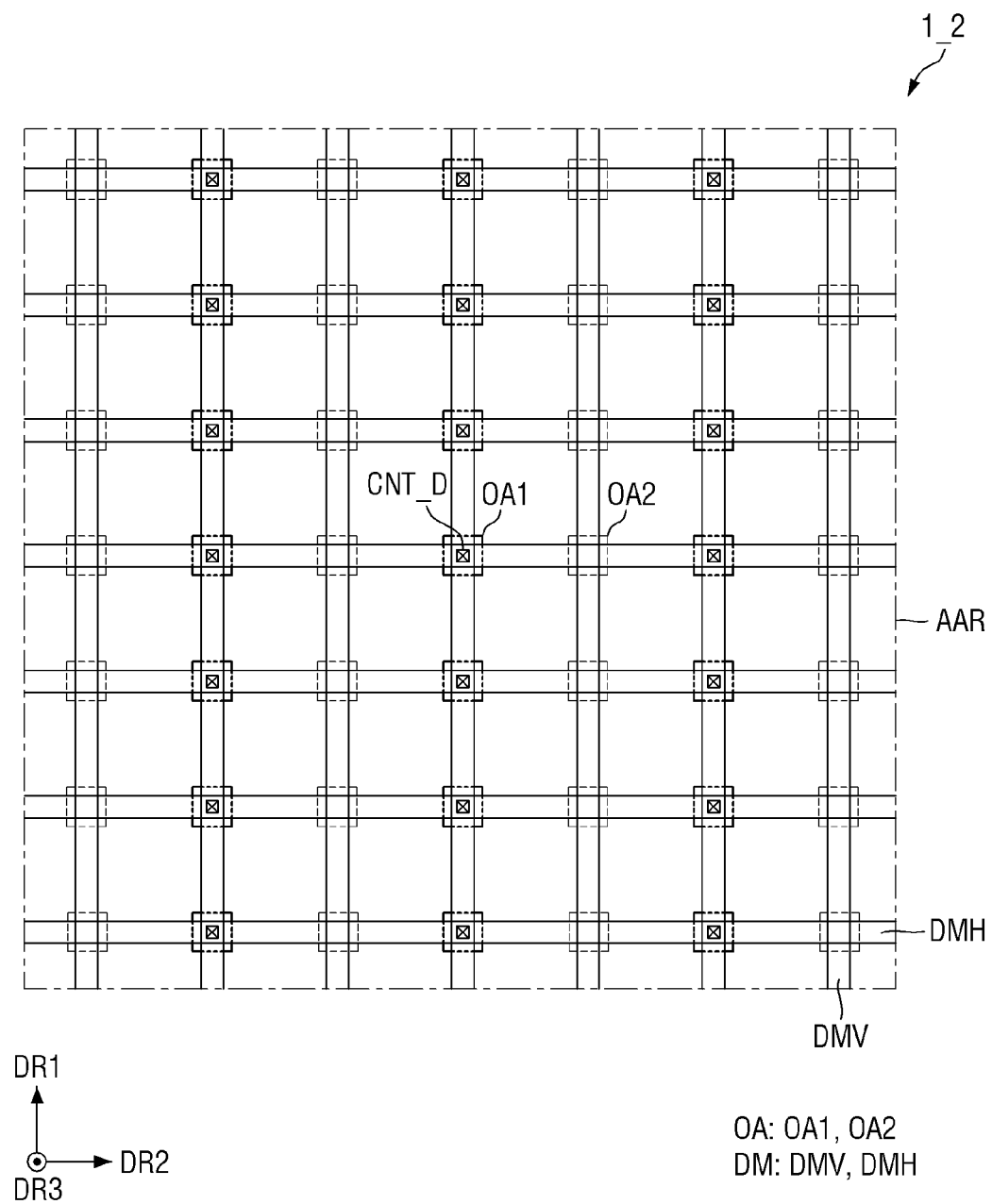
FIG. 14 is an enlarged plan view illustrating an embodiment of a constant voltage line.

FIG. 14 is an enlarged plan view illustrating an embodiment of a constant voltage line DM.

Referring to FIG. 14, first overlap areas OA1 in a display device 1_2 are continuously disposed in the first direction DR1 and the first overlap areas OA1 and second overlap areas OA2 are repeatedly disposed in the second direction DR2. Each of the first overlap areas OA1 and the second overlap areas OA2 of the display device 1_2 may be disposed per area where the first constant voltage line DMV and the second constant voltage line DMH overlap each other, along the first direction DR1. The first overlap area OA1 and the second overlap area OA2 may be disposed along the second direction DR2 alternately and repeatedly. That is, a single first constant voltage line DMV is connected to a plurality of second constant voltage lines DMH.

Even in this case, the first constant voltage line DMV and the second constant voltage line DMH may be electrically connected with each other to disperse a current, and the first constant voltage line DMV and the second constant voltage line DMH are electrically insulated from each other in some portions (second overlap areas OA2) of the area where the first constant voltage line DMV and the second constant voltage line DMH overlap each other, whereby a visible defect of the first constant voltage line DMV, which is caused by diffused reflection, may be suppressed or effectively prevented. Also, in the display area AAR, the first overlap area OA1 and the second overlap area OA2 may be arranged in various ways, whereby the visible defect of the first constant voltage line DMV may actively be suppressed or effectively prevented.

Figure 15:
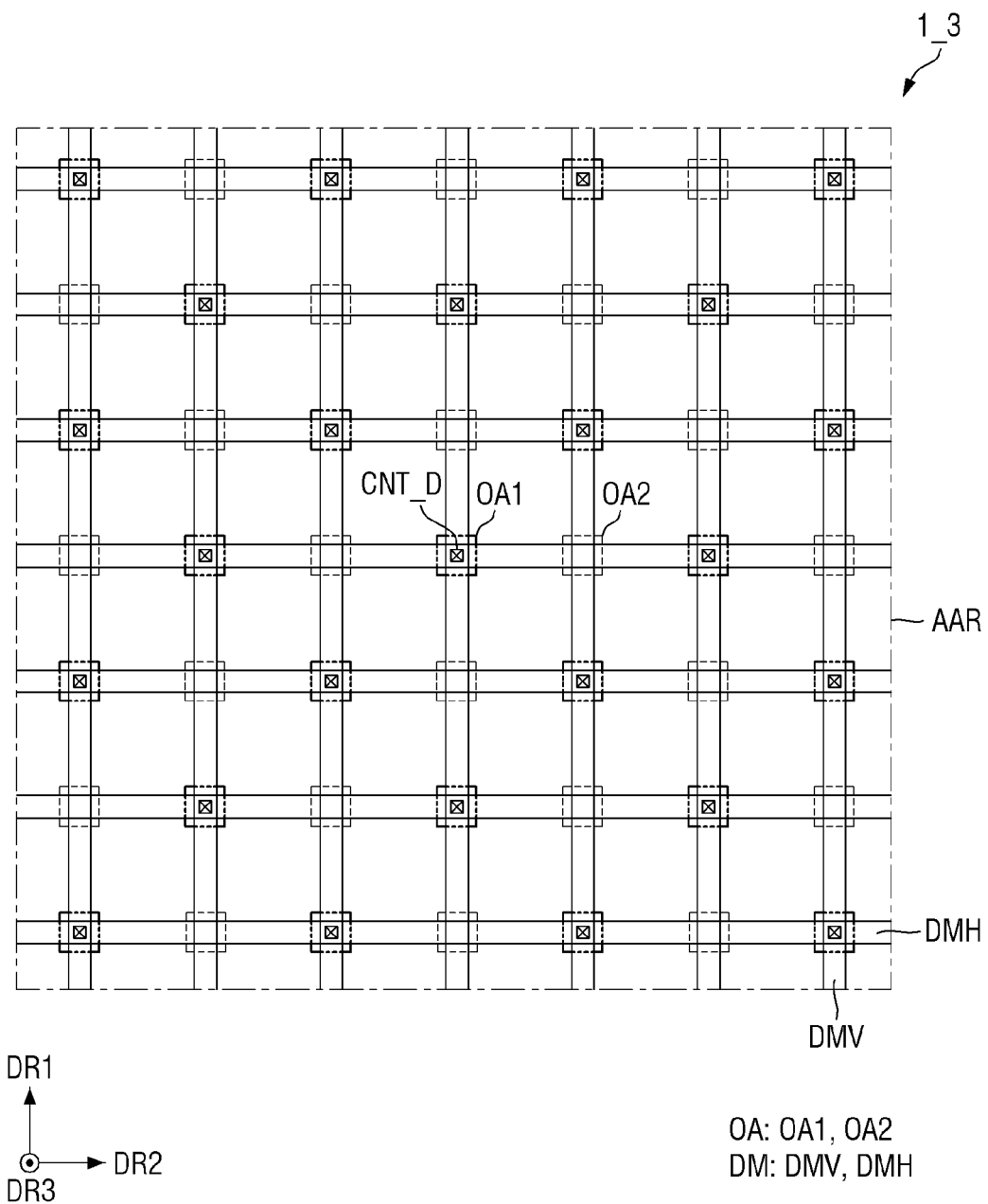
FIG. 15 is an enlarged plan view illustrating an embodiment of a constant voltage line.

FIG. 15 is an enlarged plan view illustrating an embodiment of a constant voltage line DM.

Referring to FIG. 15, first overlap area OA1 and second overlap area OA2 in a display device 1_3 are disposed along the first direction DR1 alternately and repeatedly, and the first overlap area OA1 and the second overlap area OA2 are disposed in the second direction DR2 alternately and repeatedly. That is, the constant voltage line DM includes the plurality of first overlap areas OA1 and the plurality of second overlap areas OS2 which alternate with each other along the first direction DR1 and along the second direction DR2.

Even in this case, the first constant voltage line DMV and the second constant voltage line DMH may be electrically connected with each other to disperse a current, and the first constant voltage line DMV and the second constant voltage line DMH are electrically insulated from each other in some portions (second overlap areas OA2) of the area where the first constant voltage line DMV and the second constant voltage line DMH overlap each other, whereby a visible defect of the first constant voltage line DMV, which is caused by diffused reflection, may be suppressed or effectively prevented g. Also, in the display area AAR, the first overlap area OA1 and the second overlap area OA2 may be disposed in various ways, whereby the visible defect of the first constant voltage line DMV may actively be suppressed or effectively prevented.

Figure 16:
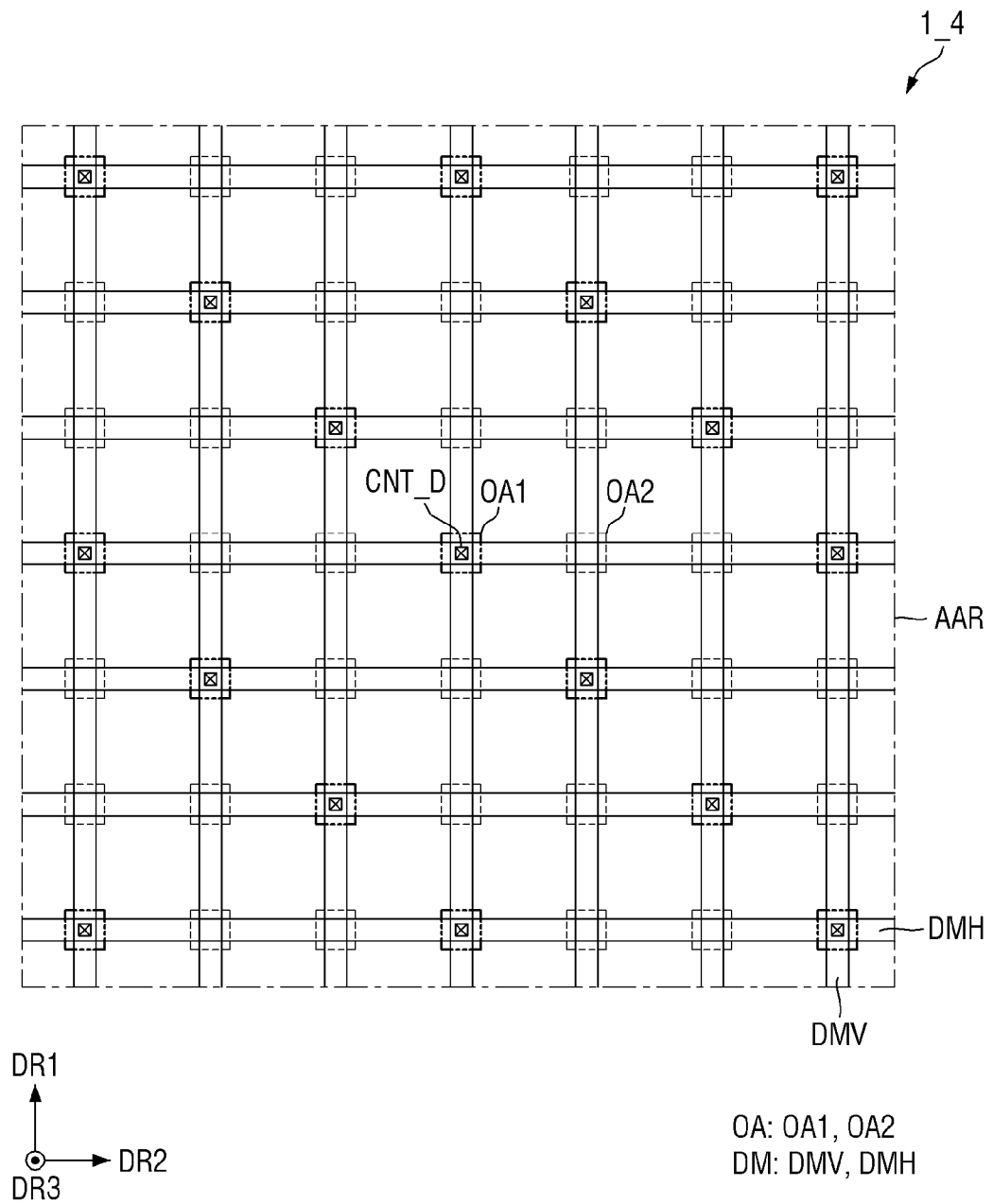
FIG. 16 is an enlarged plan view illustrating an embodiment of a constant voltage line.

FIG. 16 is an enlarged plan view illustrating an embodiment of a constant voltage line DM.

Referring to FIG. 16, one first overlap area OA1 and two continuous second overlap areas OA2 (e.g., more than one continuous second overlap areas OA2) in a display device 1_4 are disposed along the first direction DR1 alternately and repeatedly, and the one first overlap area OA1 and the two continuous second overlap areas OA2 are disposed in the second direction DR2 alternately and repeatedly.

Even in this case, the first constant voltage line DMV and the second constant voltage line DMH may be electrically connected with each other to disperse a current, and the first constant voltage line DMV and the second constant voltage line DMH are electrically insulated from each other in some portions (second overlap areas OA2) of the area where the first constant voltage line DMV and the second constant voltage line DMH overlap each other, whereby a visible defect of the first constant voltage line DMV, which is caused by diffused reflection, may be suppressed or effectively prevented. Also, in the display area AAR, the first overlap area OA1 and the second overlap area OA2 may be disposed in various ways, whereby the visible defect of the first constant voltage line DMV may actively be suppressed or prevented.

Figure 17:
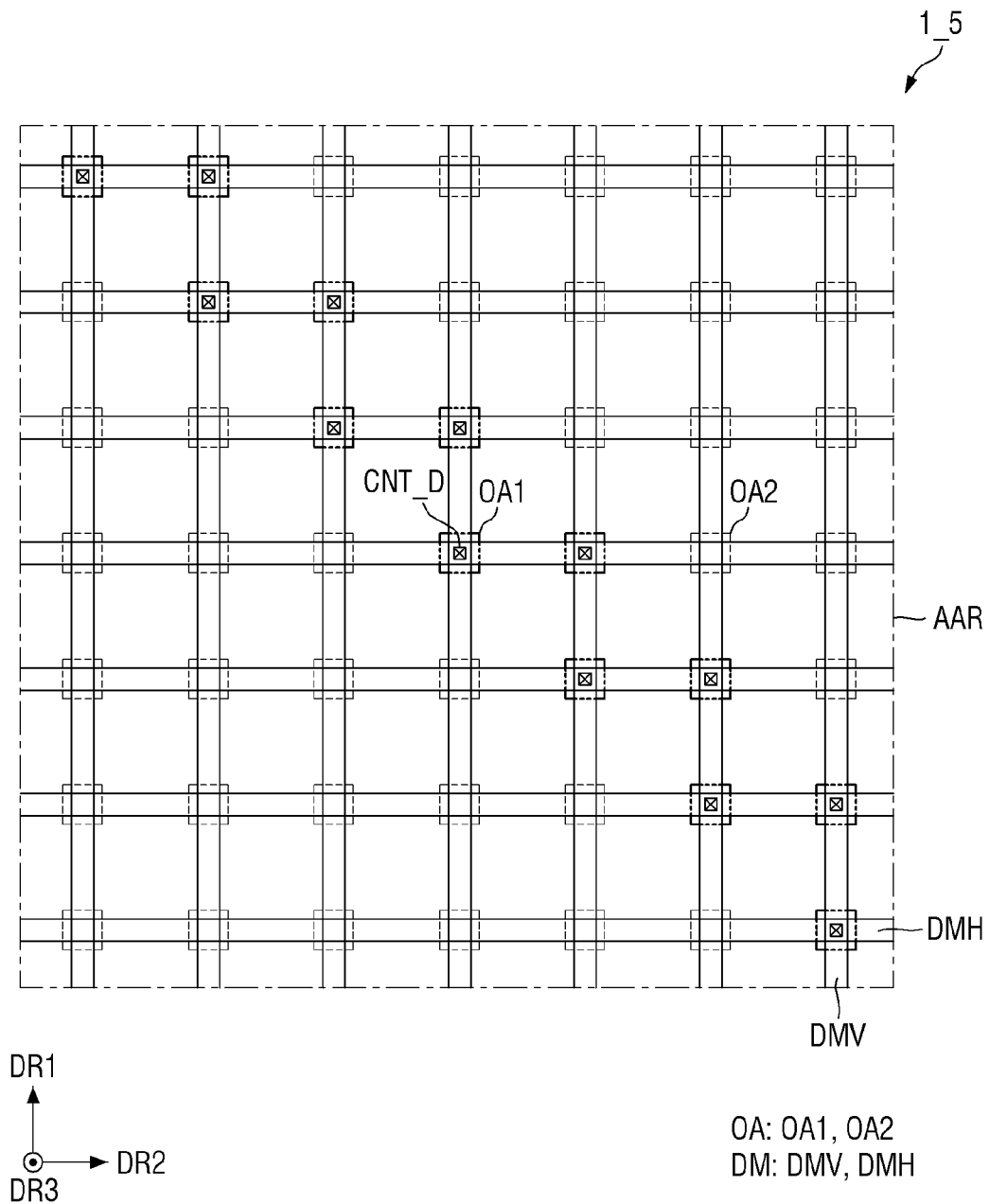
FIG. 17 is an enlarged plan view illustrating an embodiment of a constant voltage line.

FIG. 17 is an enlarged plan view illustrating an embodiment of a constant voltage line DM.

Referring to FIG. 17, a number of first overlap areas OA1 in a display device 1_5 are continuously disposed in the first direction DR1 and the second direction DR2 to define a group of first overlap areas OA1. The first overlap areas OA1 are consecutively disposed along a direction inclined with respect to the first direction DR1 and the second direction DR2. That is, groups of the first overlap areas OA1 are consecutively disposed along the direction inclined with respect to the first direction DR1 and the second direction DR2.

In detail, two first overlap areas OA1 may continuously be disposed along the second direction DR2. The two first overlap areas OA1 continuously disposed in the second direction DR2 may be disposed along a same one of the second constant voltage lines DMH arranged along the first direction DR1 and define a group of first overlap areas OA1. Groups of the first overlap areas OA1 may be staggered along on the first direction DR1. However, without limitation to this case, the number of the first overlap areas OA1 continuous in the second direction DR2 may be three or more to define a respective group.

Even in this case, the first constant voltage line DMV and the second constant voltage line DMH may be electrically connected with each other to disperse a current, and the first constant voltage line DMV and the second constant voltage line DMH are electrically insulated from each other in some portions (second overlap areas OA2) of the area where the first constant voltage line DMV and the second constant voltage line DMH overlap each other, whereby a visible defect of the first constant voltage line DMV, which is caused by diffused reflection, may be suppressed or effectively prevented. Also, in the display area AAR, the first overlap area OA1 and the second overlap area OA2 may be disposed in various ways, whereby the visible defect of the first constant voltage line DMV may actively be suppressed or prevented.

Figure 18:
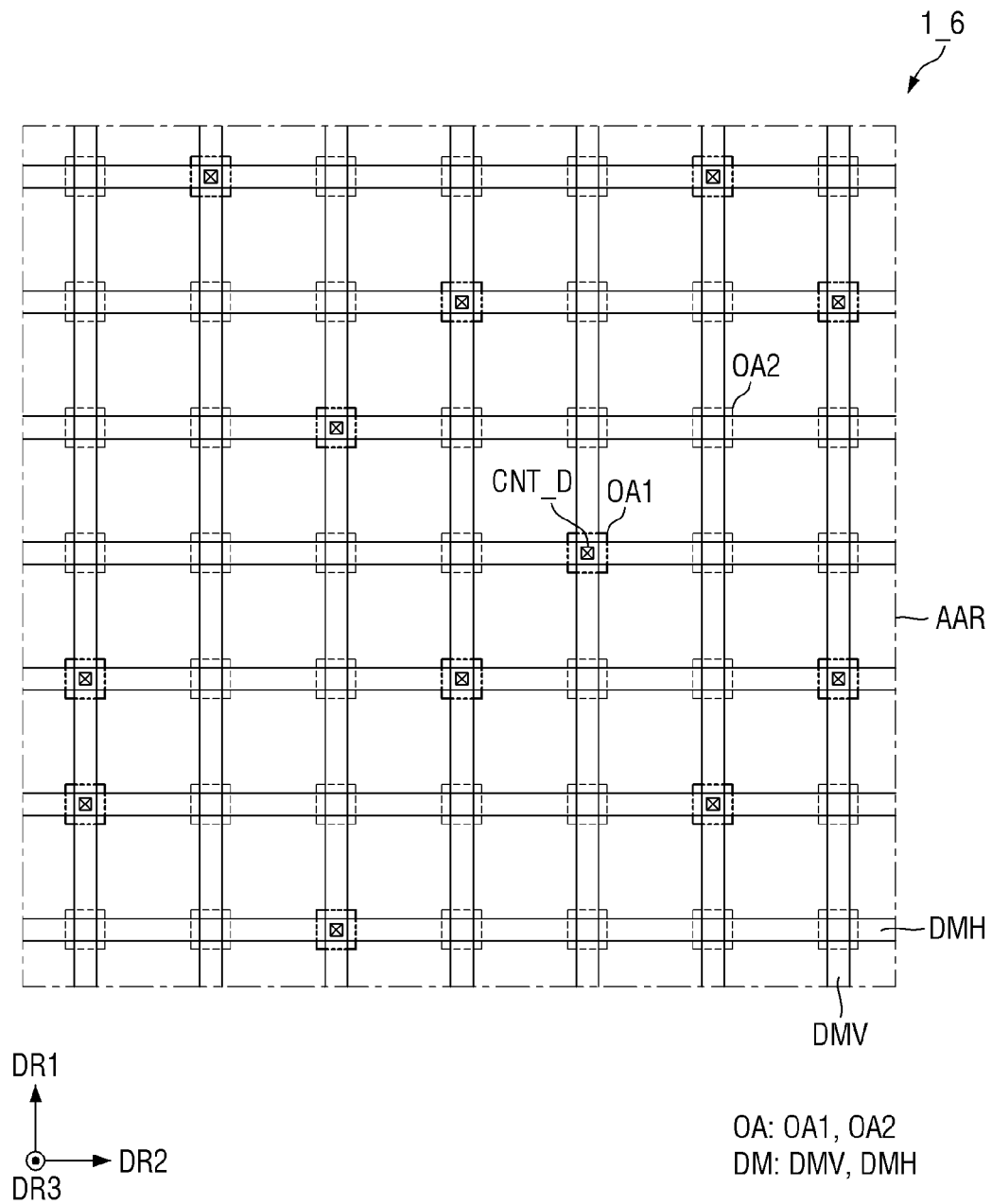
FIG. 18 is an enlarged plan view illustrating an embodiment of a constant voltage line.

FIG. 18 is an enlarged plan view illustrating an embodiment of a constant voltage line DM.

Referring to FIG. 18, first overlap areas OA1 and second overlap area OA2 in a display device 1_6 do not have a pattern. In other words, the arrangement of the first overlap area OA1 and the second overlap area OA2 disposed on the plane does not have regularity, and the first overlap area OA1 and the second overlap area OA2 may be disposed randomly at areas where the first constant voltage line DMV and the second constant voltage line DMH overlap each other.

Even in this case, the first constant voltage line DMV and the second constant voltage line DMH may be electrically connected with each other to disperse a current, and the first constant voltage line DMV and the second constant voltage line DMH are electrically insulated from each other in some portions (second overlap areas OA2) of the area where the first constant voltage line DMV and the second constant voltage line DMH overlap each other, whereby a visible defect of the first constant voltage line DMV, which is caused by diffused reflection, may be suppressed or effectively prevented. Also, in the display area AAR, the first overlap area OA1 and the second overlap area OA2 may be disposed in various ways, whereby the visible defect of the first constant voltage line DMV may actively be suppressed or prevented.

In concluding the detailed description, those skilled in the art will appreciate that many variations and modifications can be made to the embodiments without substantially departing from the principles of the present disclosure. Therefore, the disclosed embodiments of the invention are used in a generic and descriptive sense only and not for purposes of limitation.

What is claimed is:

1. A display device comprising:
a plurality of pixels; and
a constant voltage line electrically connected to the pixels, the constant voltage line comprising:
a plurality of first constant voltage lines extended along a first direction and arranged along a second direction crossing the first direction;
a plurality of second constant voltage lines extended along the second direction and arranged along the first direction;
a plurality of first overlap areas in which the plurality of first constant voltage lines and the plurality of second constant voltage lines respectively overlap and contact each other; and
a plurality of second overlap areas in which the plurality of first constant voltage lines and the plurality of second constant voltage lines respectively overlap and are insulated from each other.

2. The display device of claim 1, wherein
each of the plurality of first constant voltage lines is electrically connected to at least one of the plurality of second constant voltage lines, and
each of the plurality of second constant voltage lines is electrically connected to at least one of the plurality of first constant voltage lines.

3. The display device of claim 2, wherein the plurality of first overlap areas are arranged along a direction inclined to the first direction and the second direction.

4. The display device of claim 1, further comprising:
a display area including the plurality of pixels, and
a non-display area adjacent to the display area,
wherein the plurality of first overlap areas and the plurality of second overlap areas are in the display area.

5. The display device of claim 1, wherein the plurality of first overlap areas and the plurality of second overlap areas alternate with each other along the first direction and along the second direction.

6. The display device of claim 1, wherein
the plurality of first overlap areas are consecutively arranged along the first direction, and
the plurality of first overlap areas and the plurality of second overlap areas alternate with each other along the second direction.

7. The display device of claim 1, further comprising:
a plurality of data lines which are electrically connected to the plurality of pixels and provide a data signal to the plurality of pixels, the plurality of data lines extended along the first direction, and spaced apart from each of the plurality of first constant voltage lines and each of the plurality of second constant voltage lines,
a plurality of line pads electrically connected to the plurality of data lines and through which the data signal is provided to the plurality of data lines, and
a connection line electrically connecting a portion of the plurality of data lines with a portion of the plurality of line pads,
wherein the plurality of data lines include:
a first data line directly electrically connected to a first line pad among the plurality of line pads, and
a second data line electrically connected to a second line pad among the plurality of line pads, by the connection line.

8. The display device of claim 7, wherein the connection line includes:
a first connection line extended along the first direction,
a second connection line extended along the second direction,
each of the first connection line and the second connection line including a first end and a second end which is opposite to the first end,
the first end of the first connection line connected to the second line pad,
the second end of the first connection line connected to the first end of the second connection line, and
the second end of the second connection line connected to the second data line.

9. The display device of claim 8, wherein
a first constant voltage line among the plurality of first constant voltage lines and the first connection line are arranged along a same extension line, and
a second constant voltage line among the plurality of second constant voltage lines and the second connection line are arranged along a same extension line.

10. The display device of claim 9, further comprising a first conductive layer and a second conductive layer arranged along a thickness direction of the display device, wherein
the first connection line, the first constant voltage line and the plurality of data lines are respective patterns of the first conductive layer, and
the second connection line and the second constant voltage line are respective patterns of the second conductive layer.

11. The display device of claim 7, further comprising:
a display area including the plurality of pixels, and
a non-display area adjacent to the display area,
wherein the connection line and the second data line contact each other in the display area.

12. The display device of claim 1, further comprising a first conductive layer and a second conductive layer arranged along a thickness direction of the display device, wherein
the plurality of first constant voltage lines are respective patterns of the first conductive layer, and
the plurality of second constant voltage lines respective patterns of the.

13. The display device of claim 1, wherein the constant voltage line transmits a constant voltage through both the plurality of first constant voltage lines and the plurality of second constant voltage lines.

14. The display device of claim 13, wherein the plurality of pixels includes light emitting elements which receive the constant voltage from the constant voltage line.

15. A display device comprising:
a semiconductor layer including a channel of a transistor; and
in order from the semiconductor layer:
a first insulating layer;
a gate electrode of the transistor;
a second insulating layer;
a plurality of first constant voltage lines;
a third insulating layer; and
a plurality of second constant voltage lines overlapping the plurality of first constant voltage lines with the third insulating layer interposed therebetween to define overlap areas where the plurality of first constant voltage lines overlap the plurality of second constant voltage lines, the overlap areas including:
a first overlap area where a first constant voltage line and a second constant voltage line contact each other, and
a second overlap area where the plurality of first constant voltage lines and the plurality of second constant voltage lines are insulated from each other by the third insulating layer.

16. The display device of claim 15, wherein
the plurality of first constant voltage lines extend along a first direction, and
the plurality of second constant voltage lines extend along a second direction crossing the first direction.

17. The display device of claim 16, wherein
each of the plurality of first constant voltage lines is electrically connected to at least one of the plurality of second constant voltage lines, and
each of the plurality of second constant voltage lines is electrically connected to at least one of the plurality of first constant voltage lines.

18. The display device of claim 15, further comprising a contact hole defined in the third insulating layer,
wherein the first constant voltage line and the second constant voltage line are electrically connected to each other at the contact hole.

19. The display device of claim 15, wherein the plurality of first constant voltage lines and the plurality of second constant voltage lines transmit a constant voltage to the transistor.

20. The display device of claim 15, further comprising:
a display area including the transistor, and
a non-display area adjacent to the display area,
wherein the first overlap area and the second overlap area are in the display area.

* * * * *